United States Patent
Webjorn et al.

(10) Patent No.: US 7,062,114 B2
(45) Date of Patent: Jun. 13, 2006

(54) SUBMOUNT FOR A PHOTONIC INTEGRATED CIRCUIT (PIC) CHIP

(75) Inventors: Jonas Webjorn, Redwood City, CA (US); Robert Grencavich, Kempton, PA (US); Vinh D. Nguyen, Bethlehem, PA (US); Donald J. Pavinski, Jr., Alburtis, PA (US)

(73) Assignee: Infinera Corporation, Sunnyvale, CA (US)

( * ) Notice: Subject to any disclaimer, the term of this patent is extended or adjusted under 35 U.S.C. 154(b) by 35 days.

(21) Appl. No.: 10/852,988

(22) Filed: May 25, 2004

(65) Prior Publication Data

US 2005/0025409 A1    Feb. 3, 2005

Related U.S. Application Data

(60) Division of application No. 10/317,935, filed on Dec. 11, 2002, which is a continuation of application No. 10/267,331, filed on Oct. 8, 2002.

(60) Provisional application No. 60/392,494, filed on Jun. 28, 2002, provisional application No. 60/378,010, filed on May 10, 2002, provisional application No. 60/370,345, filed on Apr. 5, 2002, provisional application No. 60/367,595, filed on Mar. 25, 2002, provisional application No. 60/328,332, filed on Oct. 9, 2001, provisional application No. 60/328,207, filed on Oct. 9, 2001.

(51) Int. Cl.
    *G02B 6/12*    (2006.01)
(52) U.S. Cl. ...................................... 385/14
(58) Field of Classification Search ............... 385/14; 372/50.11
    See application file for complete search history.

(56) References Cited

U.S. PATENT DOCUMENTS

| | | | |
|---|---|---|---|
| 4,835,782 A | 5/1989 | Kaede et al. | 372/32 |
| 4,954,786 A | 9/1990 | Yamakawa et al. | 330/4.3 |
| 5,078,516 A | 1/1992 | Kapon et al. | 385/129 |
| 5,115,444 A | 5/1992 | Kirby et al. | 372/50 |
| 5,199,092 A | 3/1993 | Stegmueller | 385/24 |
| 5,288,659 A | 2/1994 | Koch et al. | 437/129 |
| 5,338,223 A | 8/1994 | Melatti et al. | 439/482 |
| 5,341,391 A | 8/1994 | Ishimura | 372/46 |
| 5,351,262 A | 9/1994 | Poguntke et al. | 371/102 |
| 5,394,489 A | 2/1995 | Koch | 385/14 |
| 5,418,183 A | 5/1995 | Joyner et al. | 437/129 |
| 5,428,225 A | 6/1995 | Silva et al. | 257/14 |
| 5,450,431 A | 9/1995 | Glance et al. | 372/50 |
| 5,488,507 A | 1/1996 | Nishimura | 359/344 |

(Continued)

FOREIGN PATENT DOCUMENTS

EP      0639876     2/1995

(Continued)

OTHER PUBLICATIONS

Y. Yokoyama et al., "Multi-Wavelength Locker Integrated Wide-Band Wavelength-Selectable Light Source Module", NEC Research & Development Paper 13, pp. 158-161, Feb., 2002.

(Continued)

*Primary Examiner*—Karl D. Frech
*Assistant Examiner*—Jamara A. Franklin
(74) *Attorney, Agent, or Firm*—W. Douglas Carothers, Jr.

(57) ABSTRACT

A photonic integrated circuit (PIC) chip with a plurality of electro-optic components formed on a major surface of the chip and a submount that includes a substrate that extends over the major surface of the chip forming an air gap between the substrate and the major surface, the substrate to support electrical leads for electrical connection to some of the electro-optic components on the chip major surface.

37 Claims, 23 Drawing Sheets

U.S. PATENT DOCUMENTS

| | | | |
|---|---|---|---|
| 5,530,580 A | 6/1996 | Thompson et al. | 359/248 |
| 5,536,085 A | 7/1996 | Li et al. | 372/50 |
| 5,550,666 A | 8/1996 | Zirngibl | 359/125 |
| 5,561,682 A | 10/1996 | Aoki et al. | 372/50 |
| 5,600,742 A | 2/1997 | Zirngibl | 385/37 |
| 5,612,968 A | 3/1997 | Zah | 372/50 |
| 5,617,234 A | 4/1997 | Koga et al. | 359/131 |
| 5,629,241 A | 5/1997 | Matloubian et al. | 438/125 |
| 5,631,768 A | 5/1997 | Bruno | 359/333 |
| 5,663,823 A | 9/1997 | Suzuki | 359/181 |
| 5,663,824 A | 9/1997 | Koch et al. | 359/184 |
| 5,673,141 A | 9/1997 | Gambini | 359/341 |
| 5,720,893 A | 2/1998 | Ben-Michael et al. | 216/24 |
| 5,745,270 A | 4/1998 | Koch | 359/124 |
| 5,745,613 A | 4/1998 | Fukuchi et al. | 385/24 |
| 5,784,183 A | 7/1998 | Aoki et al. | 359/124 |
| 5,787,106 A | 7/1998 | Tabuchi et al. | 372/50 |
| 5,790,729 A | 8/1998 | Pologe et al. | 385/46 |
| 5,798,859 A | 8/1998 | Colbourne et al. | 359/247 |
| 5,805,755 A | 9/1998 | Amersfoort et al. | 385/131 |
| 5,825,792 A | 10/1998 | Villeneuve et al. | 372/32 |
| 5,870,512 A | 2/1999 | Koch et al. | 385/14 |
| 5,889,906 A | 3/1999 | Chen | 385/28 |
| 5,891,748 A | 4/1999 | Sakata | 438/31 |
| 5,894,362 A | 4/1999 | Onaka et al. | 359/124 |
| 5,913,000 A | 6/1999 | Doerr et al. | 385/46 |
| 5,917,625 A | 6/1999 | Ogusu et al. | 359/130 |
| 5,946,331 A | 8/1999 | Amersfoort et al. | 372/23 |
| 5,949,562 A | 9/1999 | Kubota et al. | 359/124 |
| 5,960,014 A | 9/1999 | Li et al. | 372/20 |
| 5,963,686 A | 10/1999 | Zheng et al. | 385/27 |
| 6,005,995 A | 12/1999 | Chen et al. | 385/24 |
| 6,026,107 A | 2/2000 | Huang | 372/50 |
| 6,031,851 A | 2/2000 | Shimizu et al. | 372/18 |
| 6,055,078 A | 4/2000 | Chen et al. | 359/130 |
| 6,061,158 A | 5/2000 | DeLong | 359/133 |
| 6,101,210 A | 8/2000 | Bestwick et al. | 392/96 |
| 6,104,516 A | 8/2000 | Majima | 359/181 |
| 6,111,674 A | 8/2000 | Bhagavatula | 359/124 |
| 6,118,562 A | 9/2000 | Lee et al. | 359/124 |
| 6,120,190 A | 9/2000 | Leard et al. | 385/88 |
| 6,141,477 A | 10/2000 | Kitamura | 385/131 |
| 6,154,474 A | 11/2000 | Yoshida | 372/38 |
| 6,162,655 A | 12/2000 | Johnson et al. | 438/31 |
| 6,172,782 B1 | 1/2001 | Kobayashi | 359/128 |
| 6,174,748 B1 | 1/2001 | Jeon et al. | 438/31 |
| 6,181,849 B1 | 1/2001 | Lin et al. | 385/24 |
| 6,186,631 B1 | 2/2001 | Behringer et al. | 357/344 |
| 6,188,499 B1 | 2/2001 | Majima | 359/193 |
| 6,233,262 B1 | 5/2001 | Mesh et al. | 372/32 |
| 6,240,109 B1 | 5/2001 | Shieh | 372/18 |
| 6,261,857 B1 | 7/2001 | Alam et al. | 438/31 |
| 6,271,947 B1 | 8/2001 | Iannone et al. | 359/124 |
| 6,275,317 B1 | 8/2001 | Doerr et al. | 359/180 |
| 6,278,170 B1 | 8/2001 | Komatsu | 257/458 |
| 6,291,813 B1 | 9/2001 | Ackerman et al. | 250/214 |
| 6,301,031 B1 | 10/2001 | Li | 359/124 |
| 6,310,719 B1 | 10/2001 | Goldstein et al. | 359/344 |
| 6,323,987 B1 | 11/2001 | Rinaudo et al. | 359/260 |
| 6,369,923 B1 | 4/2002 | Kuo et al. | 359/133 |
| 6,424,439 B1 | 7/2002 | King | 359/124 |
| 6,466,707 B1 | 10/2002 | Dawes et al. | 385/14 |
| 6,501,773 B1 | 12/2002 | Volz et al. | 372/29.02 |
| 6,575,641 B1* | 6/2003 | Yamabayashi et al. | 385/88 |
| 6,704,337 B1* | 3/2004 | Kitaoka et al. | 372/50.11 |
| 2001/0019562 A1 | 9/2001 | Kai et al. | 372/20 |
| 2002/0075549 A1 | 6/2002 | Ash et al. | 359/245 |
| 2002/0126386 A1 | 9/2002 | Jordan et al. | 358/577 |
| 2002/0146191 A1 | 10/2002 | Bloemer et al. | 385/14 |

FOREIGN PATENT DOCUMENTS

| | | |
|---|---|---|
| EP | 0671792 A1 | 9/1995 |
| EP | 1047969 B1 | 11/2000 |
| JP | 58092289 | 6/1983 |
| WO | WO 00/52789 | 9/2000 |
| WO | WO 01/16642 | 3/2001 |
| WO | WO 01/17076 | 3/2001 |
| WO | WO 01/18919 | 3/2001 |
| WO | WO 01/24328 | 4/2001 |
| WO | WO 01/63962 | 8/2001 |
| WO | WO 01/63963 | 8/2001 |

OTHER PUBLICATIONS

Thomas L. Koch et al., "Semiconductor Lasers for Coherent Optical Fiber Communications", *Journal of Lightwave Technology*, vol. 8(3), pp. 274-293 Mar., 1990.

M. G. Young, "A 16 X 1 Wavelength Division Multiplexer with Integrated Distributed Bragg Reflector Lasers and Electroabsorption Modulators", *IEEE Photonics Technology Letters*, vol. 5, No. 8, pp. 908-910, Aug. 1993.

D. A. Ackerman, et al., "A Practical DBR Laser Based Wavelength Selectable DWDM Source", *IEEE LEOS Newsletter*, pp. 7-9, Oct. 2001.

M. G. Young et al., "Six Wavelength Laser Array With Integrated Amplifier and Modulator", *Electronic Letters*, vol. 32(21), pp. 1835-1836, Oct. 12, 1995.

Chung-en Zah et al., "Multiwavelength DFB Laser Arrays With Integrated Combiner and Optical Amplifier for WDM Optical Networks", *IEEE Journal of Selected Topics on Quantum Electronics*, vol. 3(2), pp. 584-597, Apr., 1997.

H. Lee, et al., "Multichannel Wavelength Locking Using Transmission Peaks of an AWG for Multichannel Optical Transmission Systems", *IEEE Photonics Technology Letters*, vol. 10, No. 2, pp. 276-278, Feb. 1998.

Raybon et al., "Reconfigurable Optoelectronic Wavelength Translation Based on an Integrated Electroabsorption Modulated Laser Array", *IEEE Photonics Technology Letters*, vol. 10(2), pp. 215-217, Feb., 1998.

Masaki Kohtoku, et al., "Polarization Independent Semiconductor Arrayed Waveguide Gratings Using a Deep-Ridge Waveguide Structure", *IEICE Trans. Electron.*, vol. E81-C, No. 8, pp. 1195-1204, Aug. 1998.

S. Ménézo, et al., "10-Wavelength 200-GHz Channel Spacing Emitter Integrating DBR Lasers with a PHASAR on InP for WDM Applications", *IEEE Photonics Technology Letters*, vol. 11, No. 7, pp. 785-787, Jul. 1999.

Kudo et al., "1.55-µm Wavelength-Selectable Microarray DFB-LD's with Monolithically Integrated MMI Combiner, SOA, and EA-Modulator", *IEEE Photonics Technology Letters*, vol. 12(3), pp. 242-244, Mar. 2000.

K. Affolter, "Integrating Active Components Improves System Design", *WDM Solutions*, pp. 65-67, Jun. 2001.

D. Johnson et al., "Spot-Size-Converted Devices for Uncooled Passive Alignment", *IEEE LEOS Newsletter*, pp. 3-7, Aug. 2001.

Beck Mason, et al., "40-Gb/s Tandem Electroabsorption Modulator", *IEEE Photonics Technology Letters*, vol. 14, No. 1, pp. 27-29, Jan. 2002.

Y. Suzuki et al., "Multi-Channel Modulation in a DWDM Monolithic Photonic Integrated Circuit", *14th Indium Phosphide and Related Materials Conference, Conference Proceedings*, May 12-16, Stockholm, Sweden, Conference Proceedings, pp. 681-683.

K. J. Park, et al., "A Multi-Wavelength Locker for WMD System", *Conference on Optical Fiber Communication*

(OFC 2000), pp. WE 4-1 to WE 4-3, Wednesday, Mar. 8, 2000.

JDS Uniphase Product Bulletin, "Fabry-Perot Wavelocker™", pp. 1-4, Nov., 2000.

K. Inoue, "Technique to Compensate Waveform Distortion in a Gain-Saturated Semiconductor Optical Amplifier Using a Semiconductor Saturable Absorber", *Electronics Letters*, vol. 34(4), pp. 376-378, Feb., 1998.

M. Bouda, "Compact High-Power Wavelength Selectable lasers for WDM Applications", *Conference on Optical Fiber Communication*, Technical Digest series, vol. 1, pp. 178-180, Mar. 7-10, 2000.

John E. Johnson et al., "Fully Stabilized Electroabsorption-Modulated Tunable DBR Laser Transmitter for Long-Haul Optical Communications", *IEEE Journal on Selected Topics in Quantum Electronics*, vol. 7(2), pp. 168-177, Mar./Apr. 2001.

Zirngibl et al., "High Performance, 12 Frequency Optical Multichannel Controller", *Electronic Letters*, vol. 30(9), pp. 700-701, Apr. 28, 1994.

Amersfoort et al., "Low-Loss Phased-Array Based 4-Channel Wavelength Demultiplexer Integrated with Photodetectors", *IEEE Photonics Technology Letters*, vol. 6(1), Jan., 1994.

Kitamura et al., "Polarization-Insensitive Semiconductor Optical Amplifier Array Grown by Selective MOVPE", *IEEE Photonics Technology Letters*, vol. 6(2), Feb., 1994.

C. H. Joyner at al., "An 8-Channel Digitally Tunable Transmitter with Electroabsorption Modulated Output by Selective-Area Epitaxy", *IEEE Photonics Technology Letters*, vol. 7(9), pp. 1013-1015, Sep., 1995.

D. Wolfson, et al., "Detailed Theoretical Investigation of the Input Power Dynamic Range for Gain-Clamped Semiconductor Optical Amplifier Gates at 10 Gb/s", *IEEE Photonic Technology Letters*, vol. 10(9), pp. 1241-1243, Sep. 1998.

Vreeburg et al., "A Low-Loss 16-Channel Polarization Dispersion Compensated PHASAR Demultiplexer", *IEEE Photonics Technology Letters*, vol. 10(3), pp. 382-384, Mar. 1998.

C. H. Joyner et al., "Low-Threshold Nine-Channel Waveguide Grating Router-Based Continuous Wave Transmitter", *Journal of Lightwave Technology*, vol. 17(4), pp. 647-651, Apr. 1999.

Möller et al. "Mode Stabilization Technique for the Multifrequency Laser", 25$^{th}$ *Optical Fiber Communication Conference, Technical Digest*, pp. 187-189, Mar. 7, 2000.

Sakano et al., "Tunable DFB Laser with a Striped Thin-Film Heater", *IEEE Photonic Technology Letters*, vol. 4(4), Apr. 1992.

K. Nakamura, et al., Buried Heterostructure DFB Laser Integrated With Ridge Waveguide Electroabsorption Modulator With Over 20 GHz Bandwidth, European Conference on Optical Communications (ECOC '97), Conference Pub. No.. 448, pp. 175-178, Sep. 22-25, 1997.

M. Kohtoku et al., "InP-Based 64-Channel Arrayed Waveguide Grating with 50 GHz Channel spacing and up to −20dB Crosstalk" 1786-1787, *Electronic Letters*, vol. 33(21), pp. , Oct. 9, 1997.

R. A. Salvatore, et al., "Electroabsorption Modulated Laser for Long Transmission Spans", *IEEE Journal of Quantum Electronics*, vol. 38(5), pp. 464-476, May 2002.

P.A. Kirby, "Multichannel Wavelength-Switched Transmitters and Receivers—New Component Concepts for Broad-Band Networks and Distributed Switching Systems", *Journal of Lightwave Technology*, vol. 8(2), pp. 202-211, Feb. 1990.

Charles H. Henry, et al., "Four-Channel Wavelength Division Multiplexers and Bandpass Filters Based on Elliptical Bragg Reflectors", *Journal of Lightwave Technology*, vol. 8(5), pp. 748-755, May 1990.

J.B.D. Soole, et al., "Monolithic InP/InGaAsP/InP Grating Spectrometer for the 1.48-1.56 μm Wavelength Range", *Applied Physics Letters*, vol. 58(18), pp. 1949-1951, May 6, 1991.

M. Zingibl, et al., "Polarization Independent 8×8 Waveguide Grating Multiplexer on InP", *Electronics Letters*, vol. 29(2), pp. 201-202, Jan. 21, 1993.

M.A. Newkirk, et al., "1.5 μm Multiquantum-Well Semiconductor Optical Amplifier with Tensile and Compressively Strained Wells for Polarization-Independent Gain", *IEEE Photonics Technology Letters*, vol. 4(4), pp. 406-408, Apr. 1993.

P. Doussiere, et al., "1.55 μm Polarization Independent Semiconductor Optical Amplifier with 25 dB Fiber Gain", *IEEE Photonics Technology Letters*, vol. 6(2), pp. 170-172, Feb. 1994.

B. Glance, et al., "Applications of the Integrated Waveguide Grating Router", *Journal of Lightwave Technology*, vol. 12(6), pp. 957-962, Jun. 1994.

Lucas B. Soldano, et al., "Optical Multi-Mode Interference Devices Based on Self-Imaging: Principles and Applications", *Journal of Lightwave Technology*, vol. 13(4), pp. 615-627, Apr. 1995.

J.B.D. Soole, et al., "Polarization-Independent InP Arrayed Waveguide Filter Using Square Cross-Section Waveguides", *Electronic Letters*, vol. 32(4), pp. 323-324, Feb. 15, 1996.

H. Tanobe, et al., "Temperature Insensitive Arrayed Waveguide Gratings in InP Substrates", *IEEE Photonics Technology Letters*, vol. 10(2), pp. 235-237, Feb. 1998.

J. Sarathy, et al., "Polarization Insensitive Waveguide Grating Routers in InP", *IEEE Photonics Technology Letters*, vol. 10(12), pp. 1763-1765, Dec. 1998.

T. Coroy et al., "Active Wavelength Measurement System Using an InGaAs-InP Quantum-Well Electroabsorption Filtering Detector", *IEEE Photonics Tecnology Letters*, vol. 8, No. 12, pp. 1686-1688, Dec. 1996.

B. Pezeshki, et al., "12nm Tunable WDM Source Using an Integrated Laser Array", *Electronics Letters*, vol. 36, No. 9, pp. 788-789, Apr. 27, 2000.

D. Alfano, "System-on-Chip Technology Adds Options for Laser Driver Control", *WDM Solutions*, pp. 43-48, Nov. 2001.

K. Inoue et al., "Signal Improvement Effect in O/E-E/O Conversion Using an Electro-Absorption (EA) Modulator", *IEEE Photonics Technology Letters*, vol. 9(1), pp. 109-111, Jan., 1997.

J. Park et al., "New design for Low-Loss Star Couplers and Arrayed Waveguide Grating devices", *IEEE Photonics Technology Letters*, vol. 14(5), pp. 651-653, May, 2002.

M. Smit et al., Photonic Integrated Circuits for Advanced Communication Networks, *International Journal of Optoelectronics*, vol. 12(1), pp. 25-30, 1998.

Sasaki et al., "Selective MOVPE Growth and Its Application to Semiconductor Photonic Integrated Circuits", Electronics & Communications in JP, vol. 76(4), pp. 1-11, Apr. 1, 1993.

Kudo et al., "1.55-mm Wavelength . . . EA-Modulator", IEEE Photonics Technology Letters, vol. 12(3), pp. 242-244, Mar. 2000.

Young et al., "16 X 1 Wavelength . . . Modulators", IEEE Photonics Technology Letters, vol. 5(8), pp. 908-910, Aug. 1, 1993.

Kameda et al., "A DBR Laser . . . Linewidth", IEEE Photonics Technology Letters, vol. 5(6), pp. 608-610, Jun. 1, 1993.

* cited by examiner

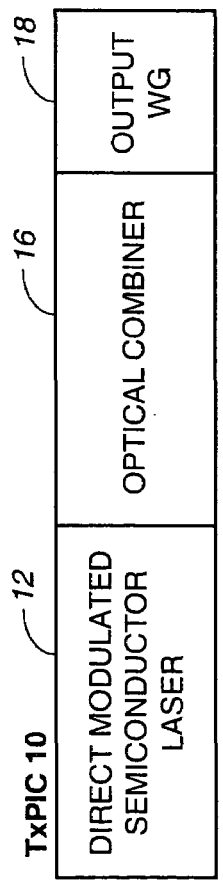
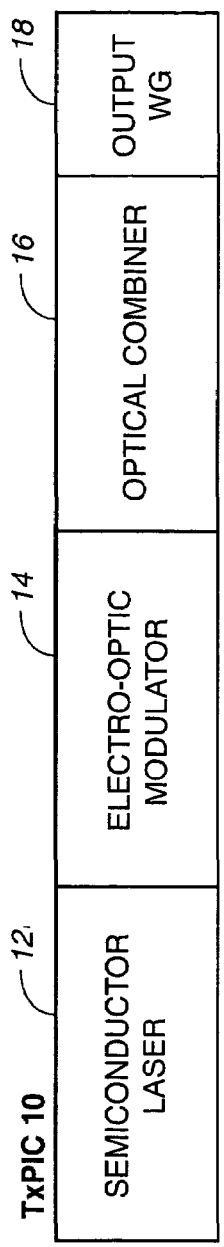
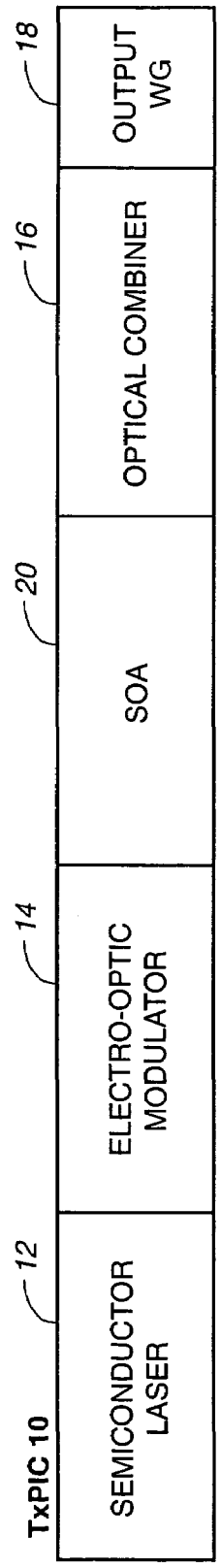
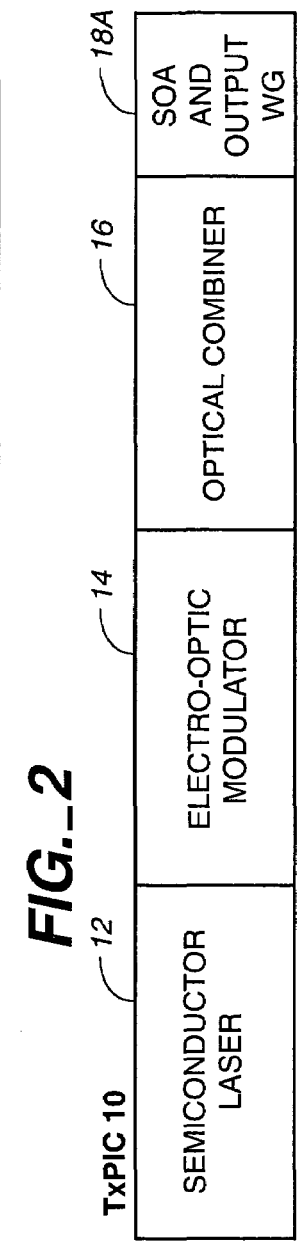

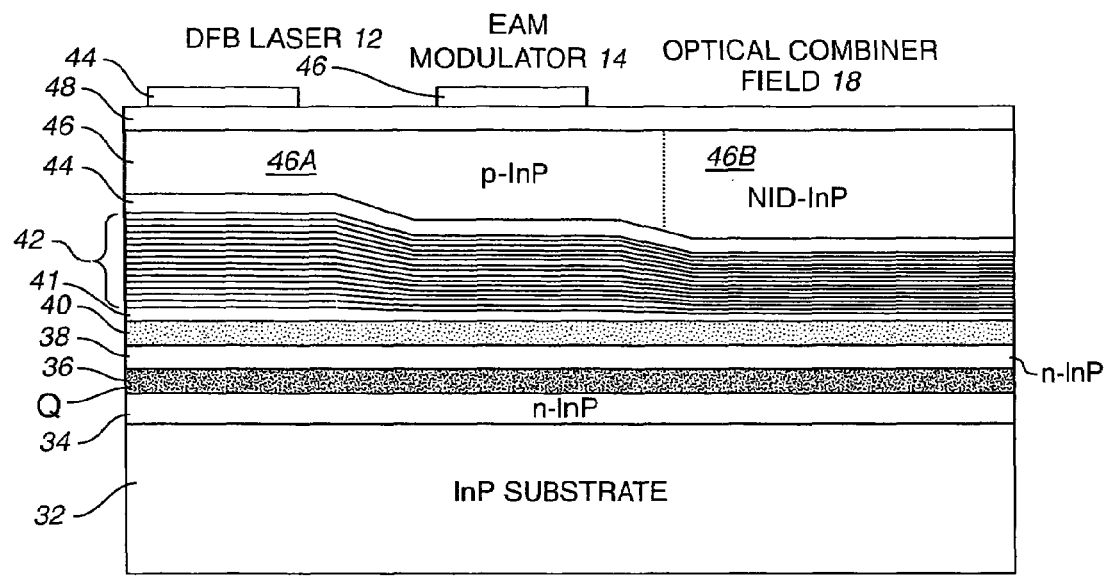
FIG._4
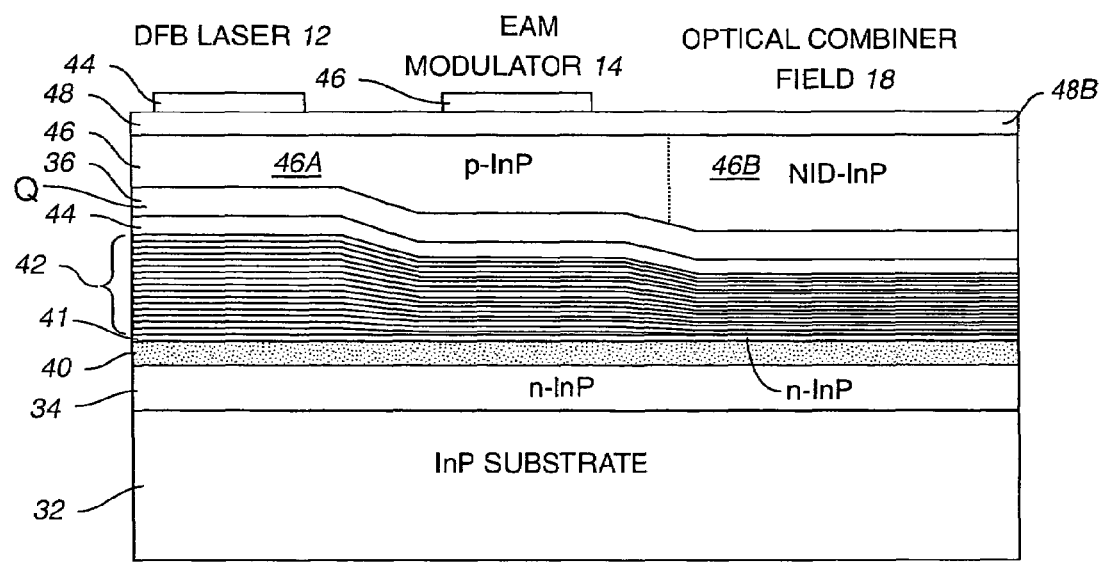
FIG._5

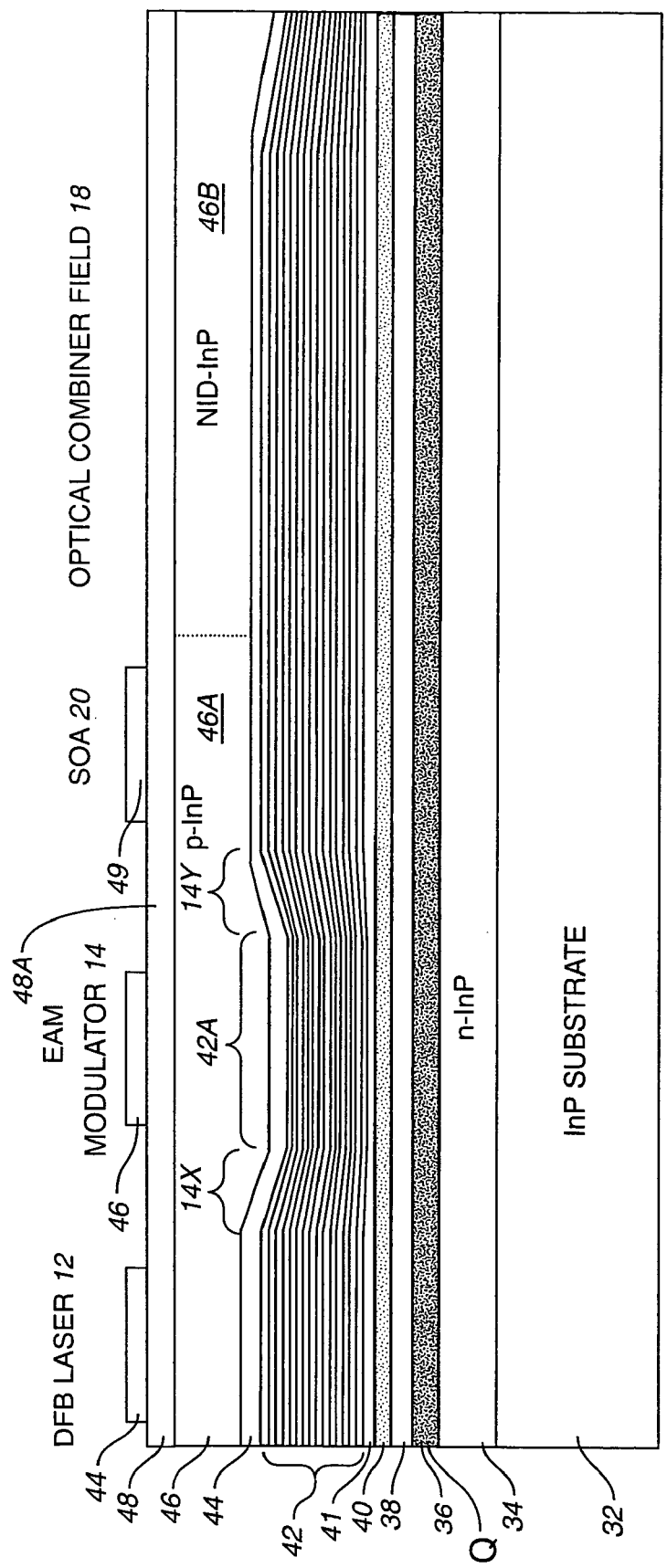
FIG._6

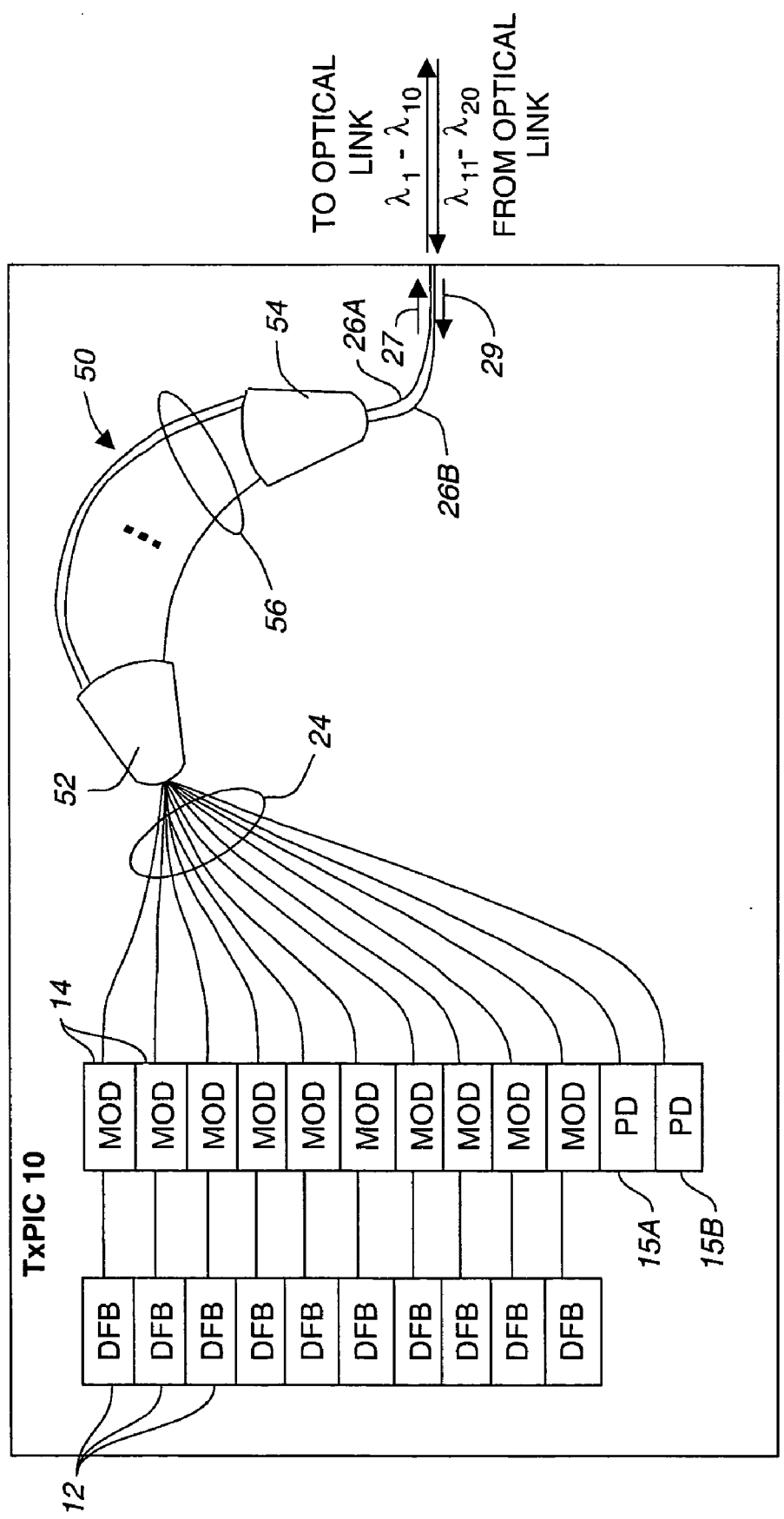
FIG._7A

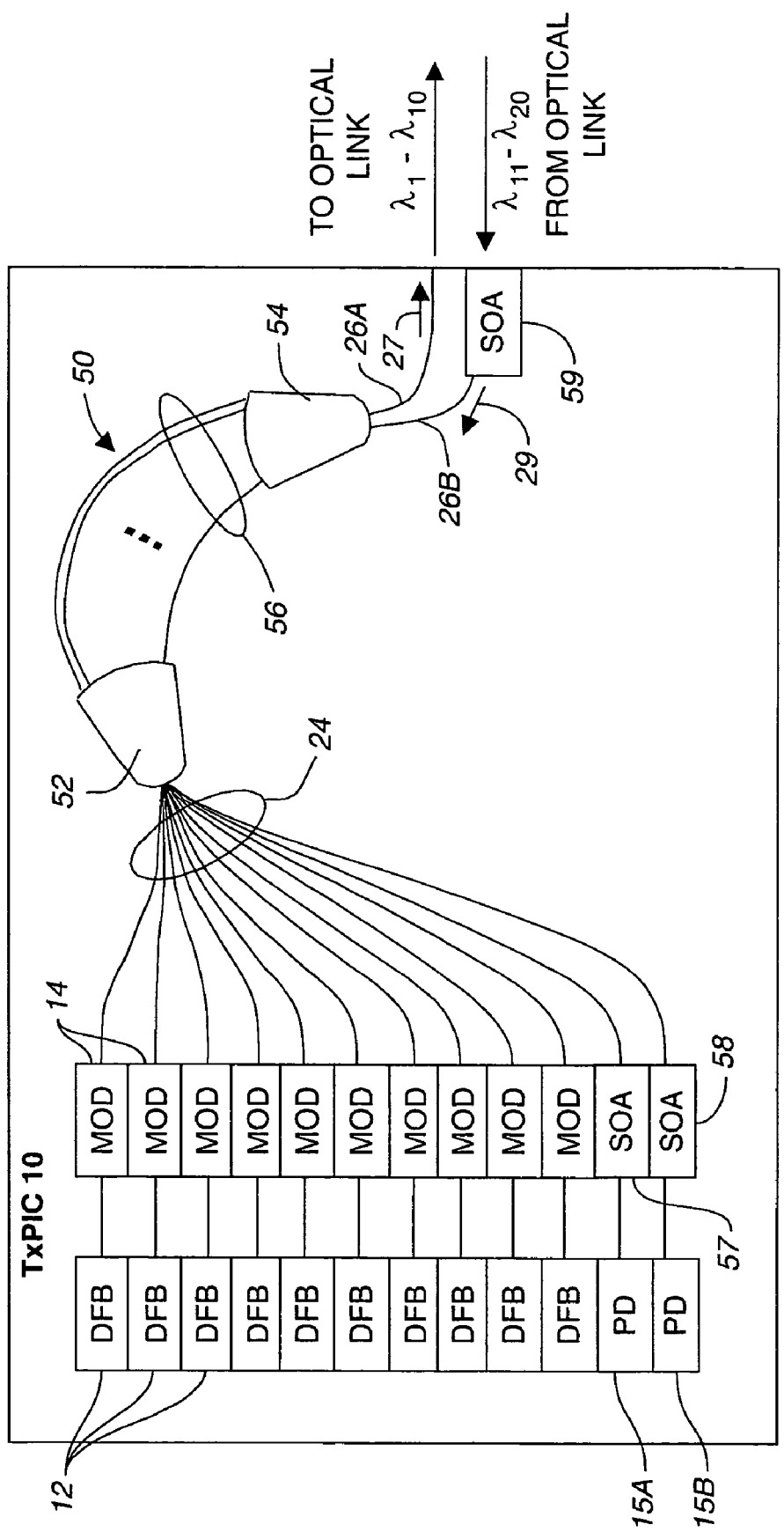
FIG._7B

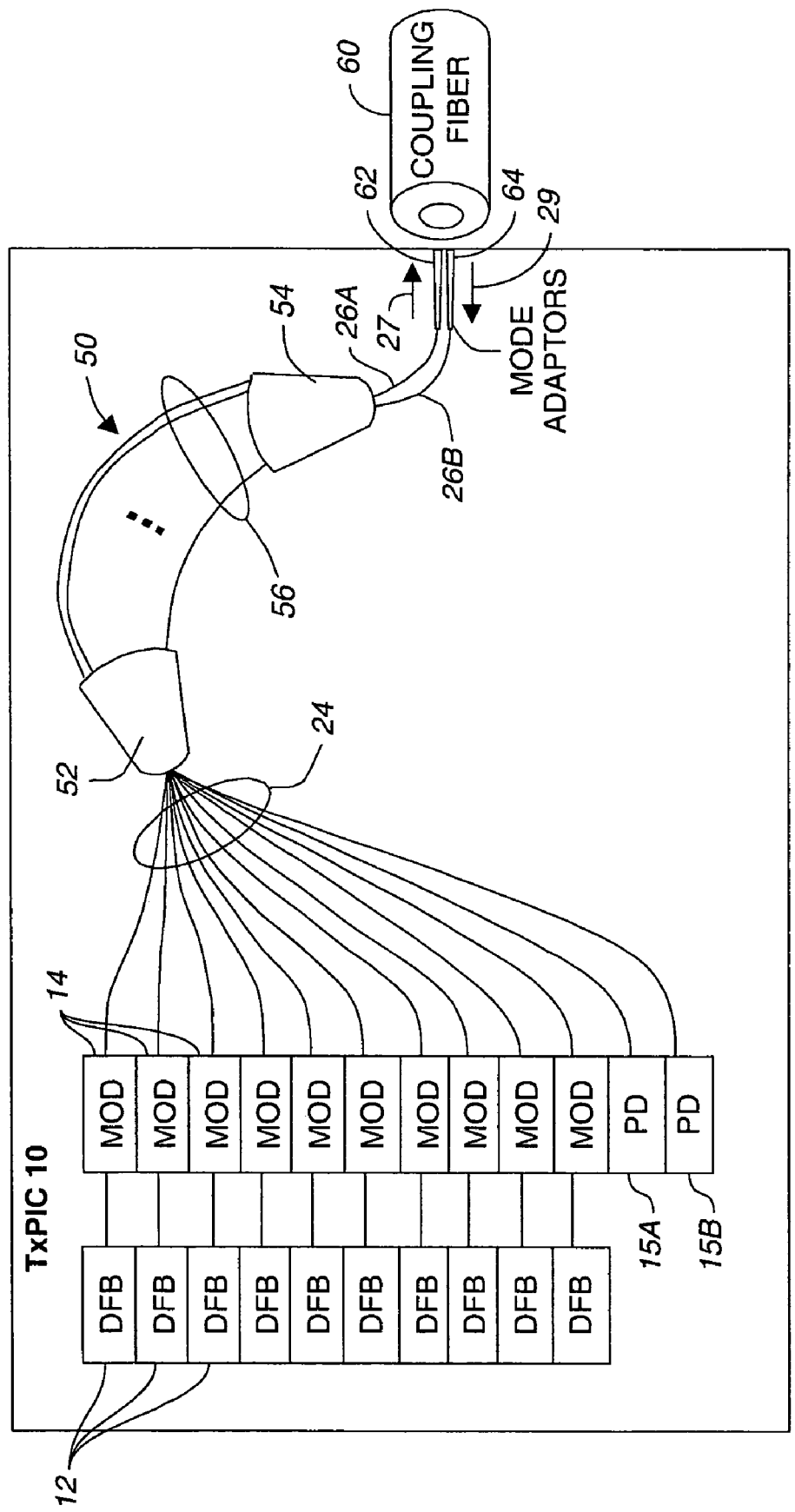
FIG._7C

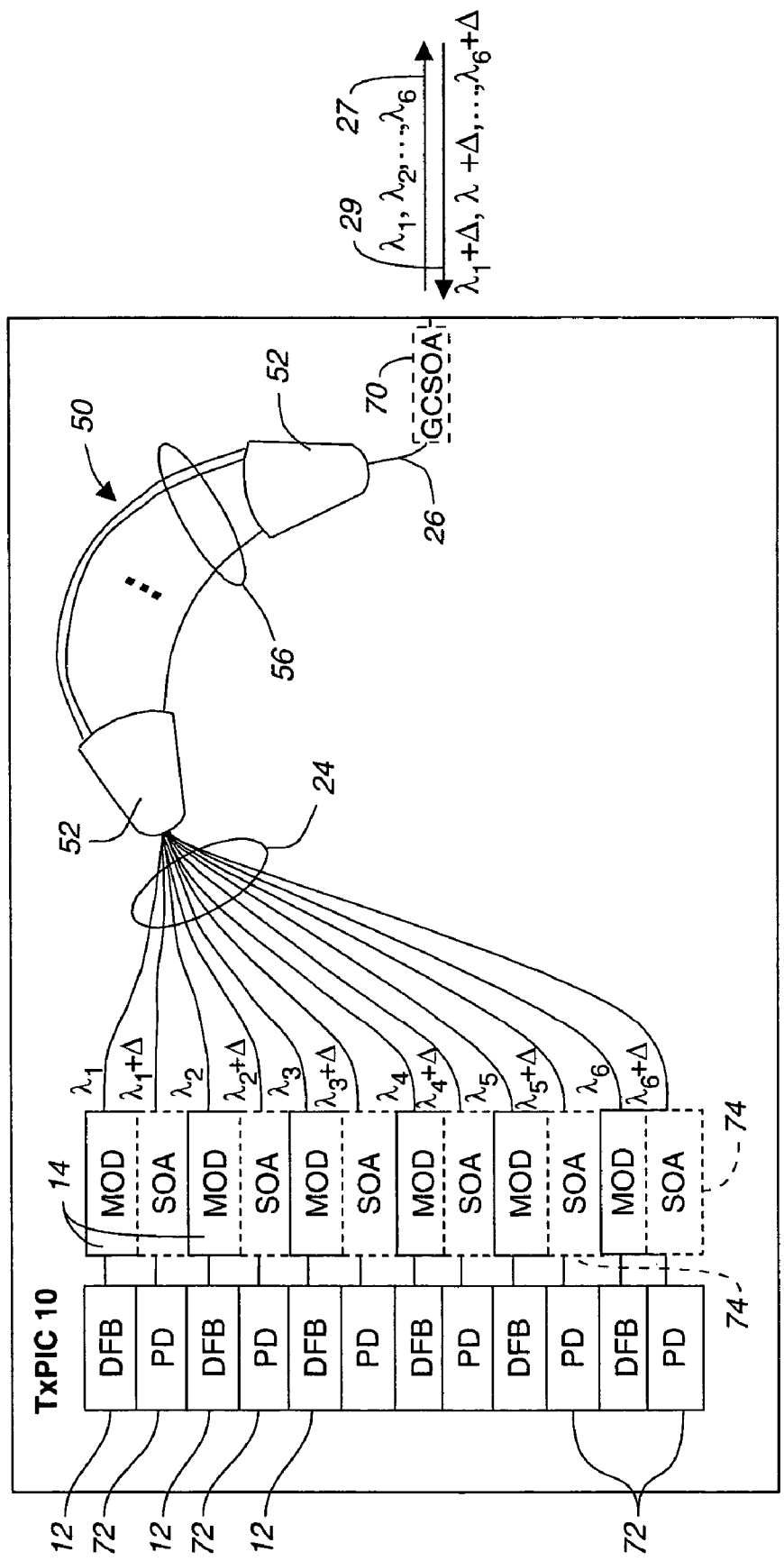

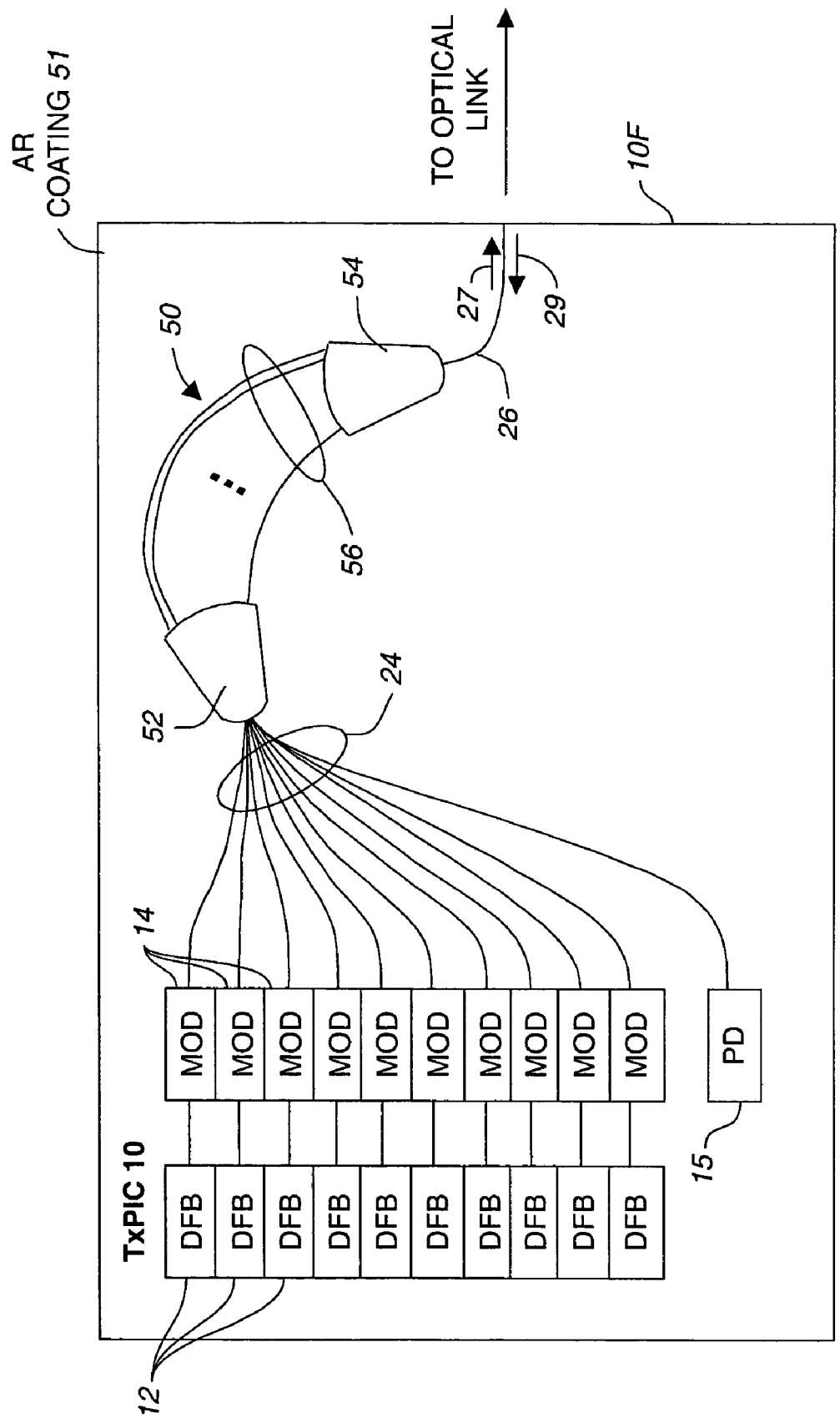
FIG._9

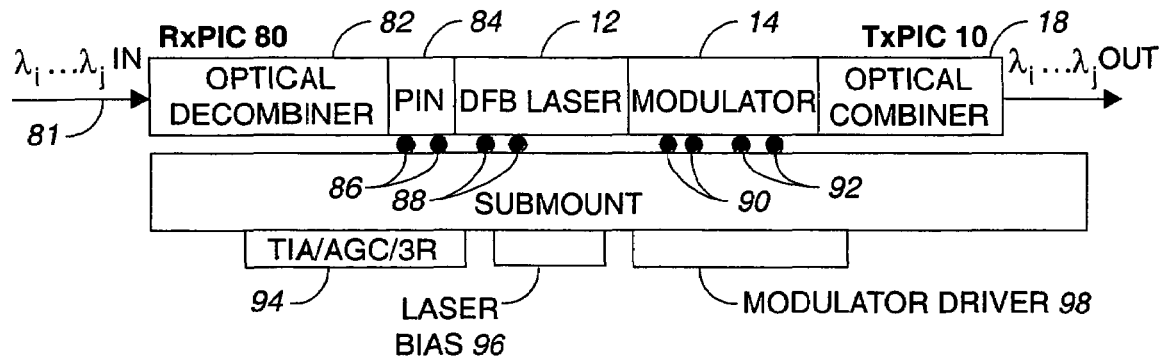
FIG._10
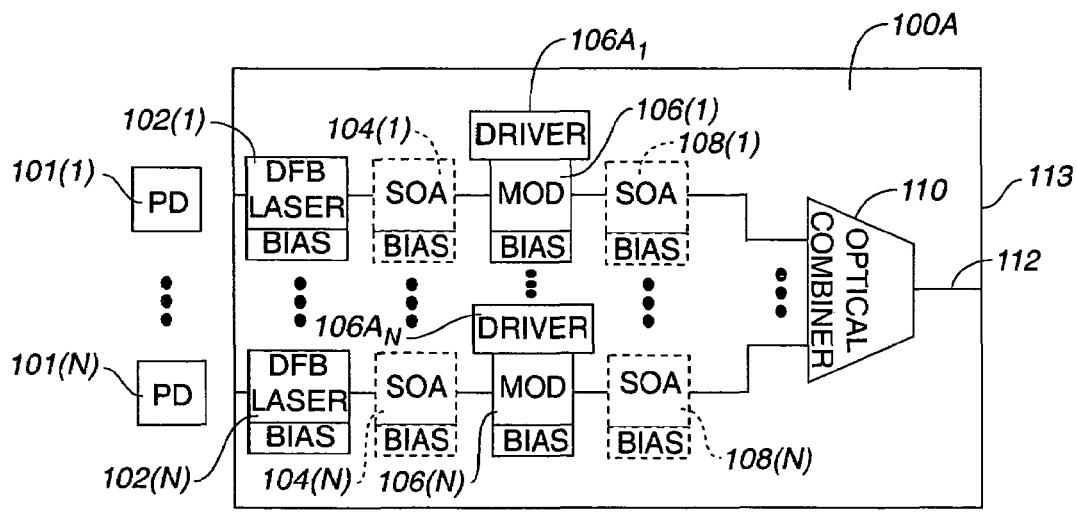
FIG._11

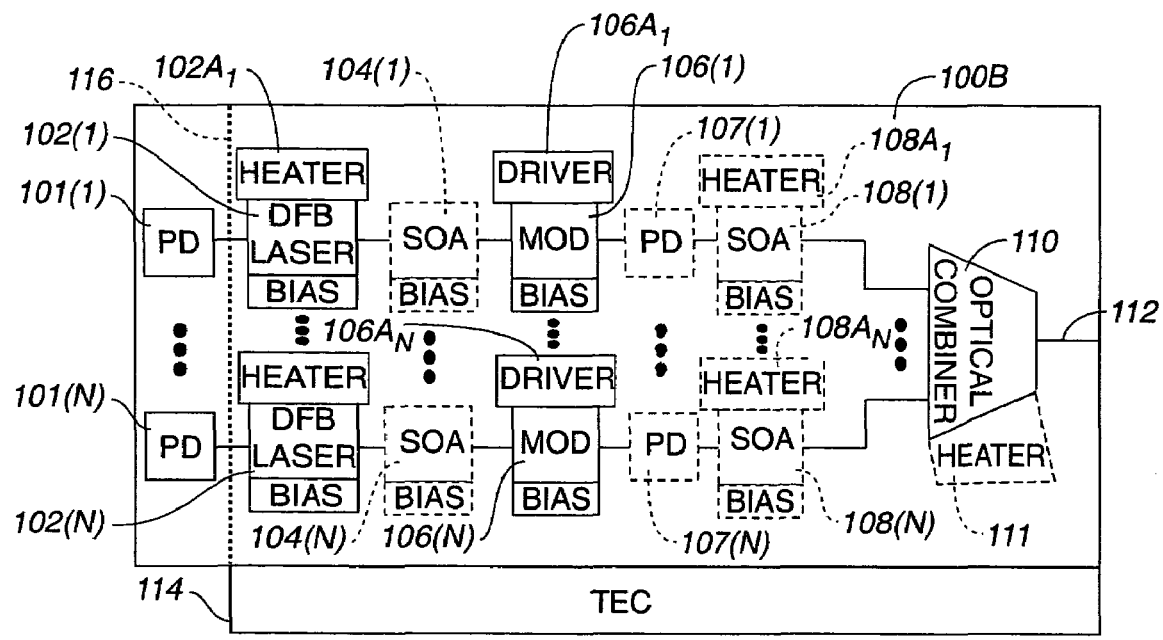
FIG._12
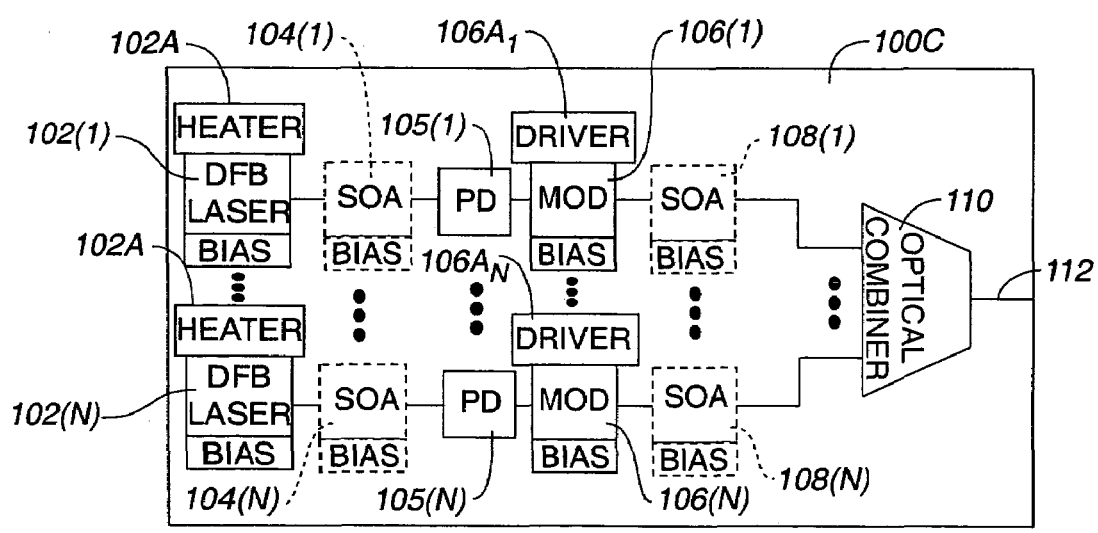
FIG._13

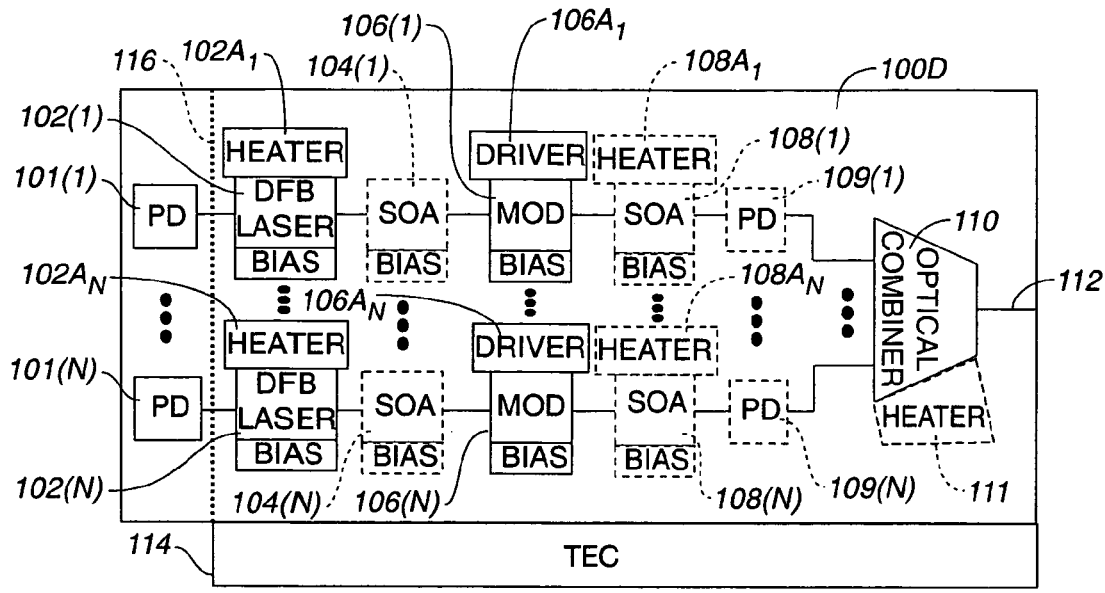
FIG._14
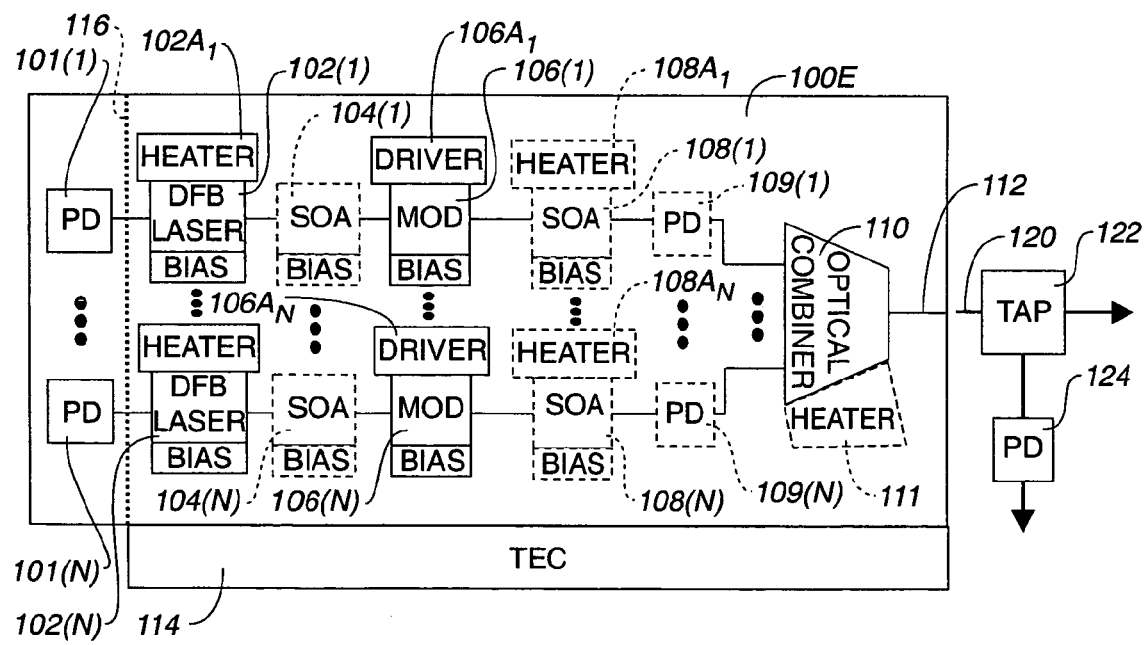
FIG._15

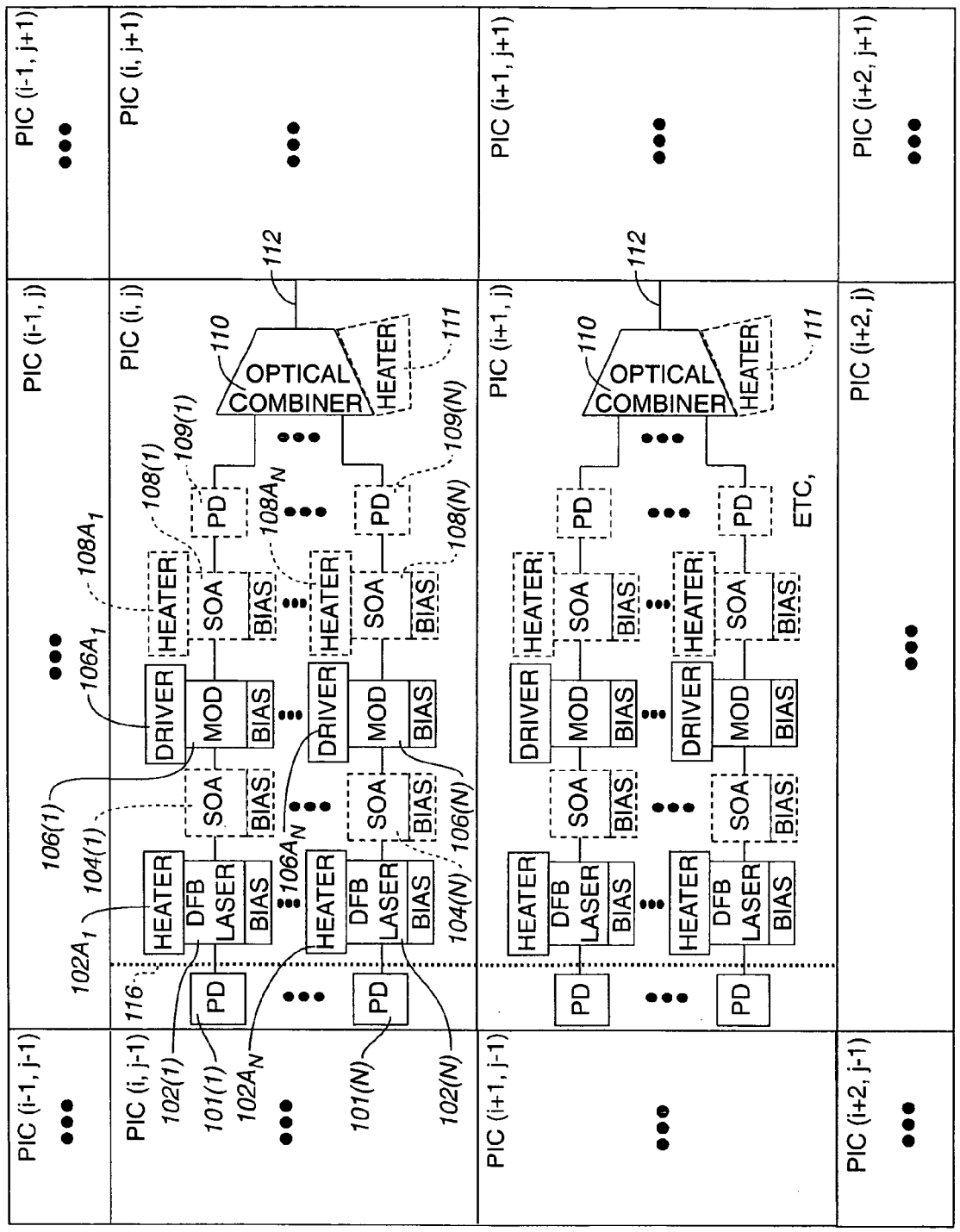
FIG._16

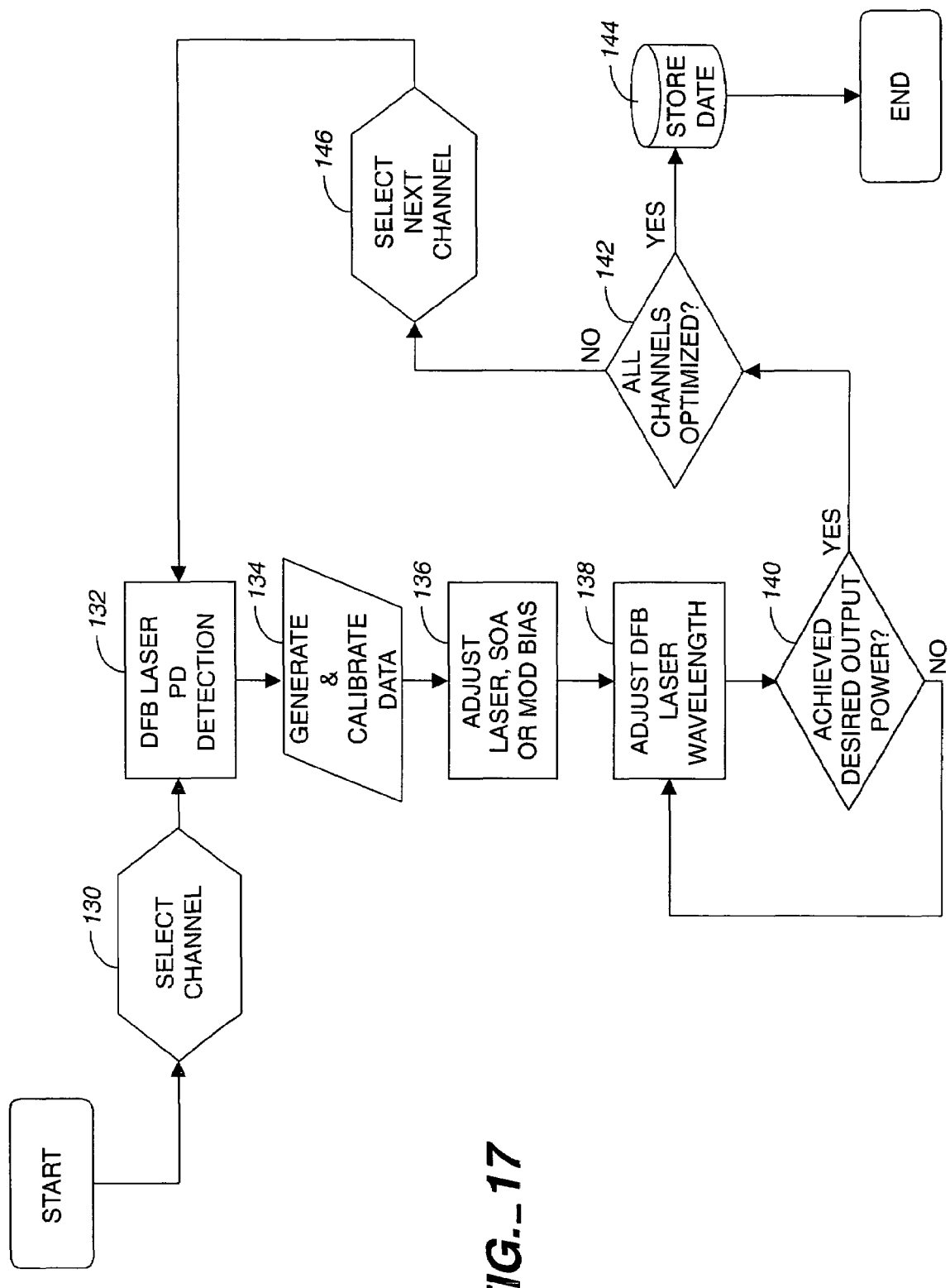
*FIG._17*

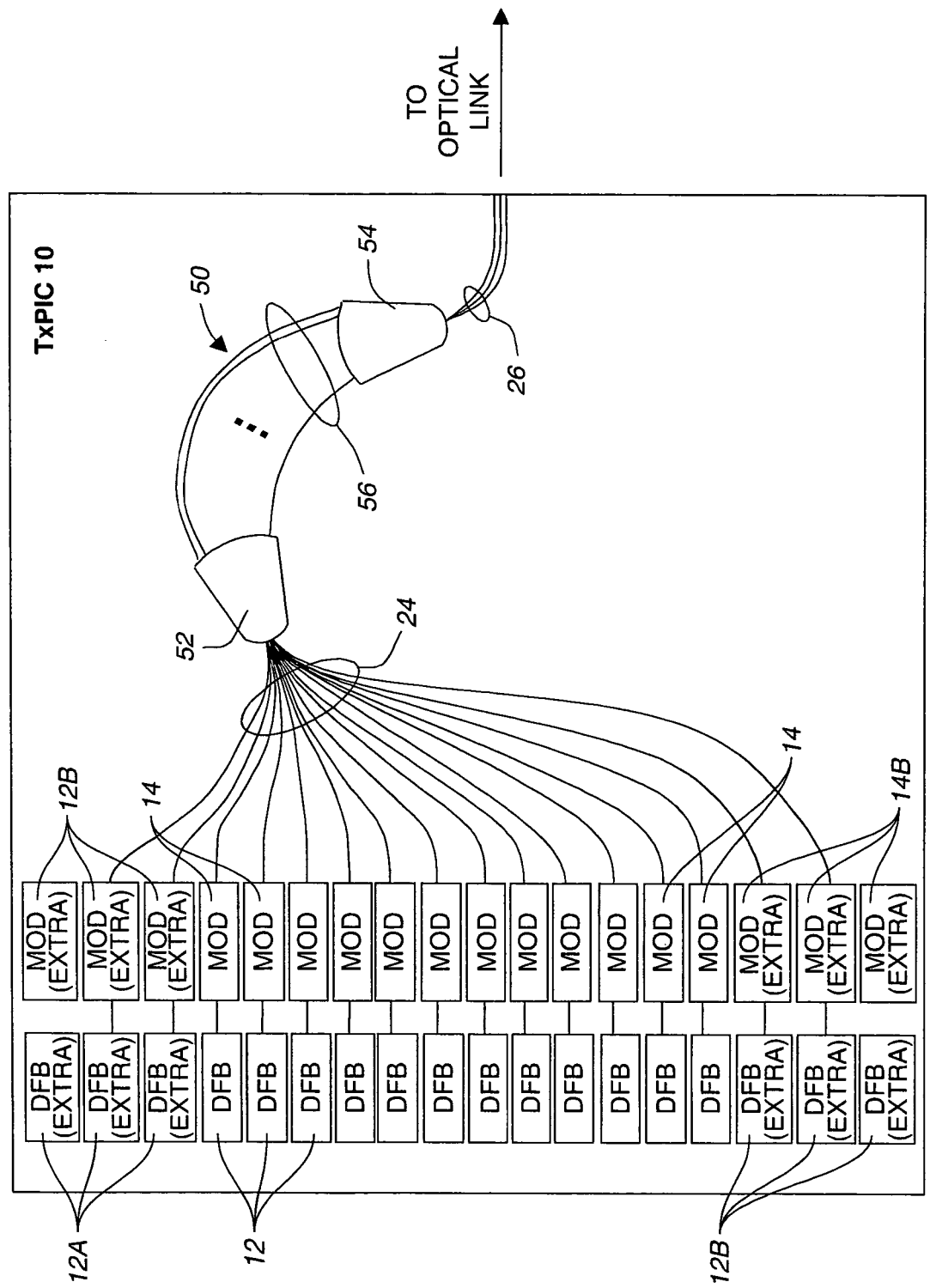
FIG._18

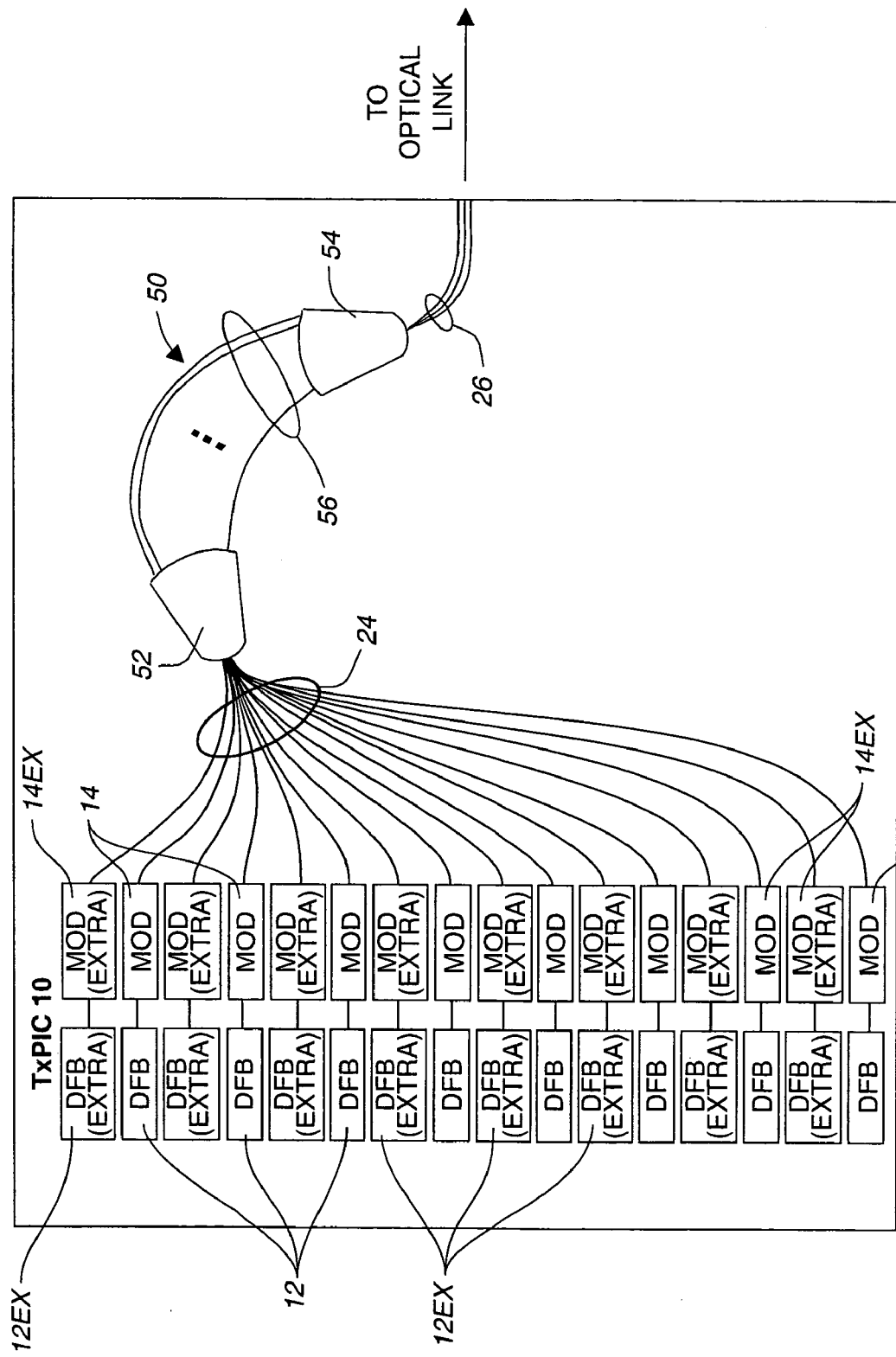
FIG._19A

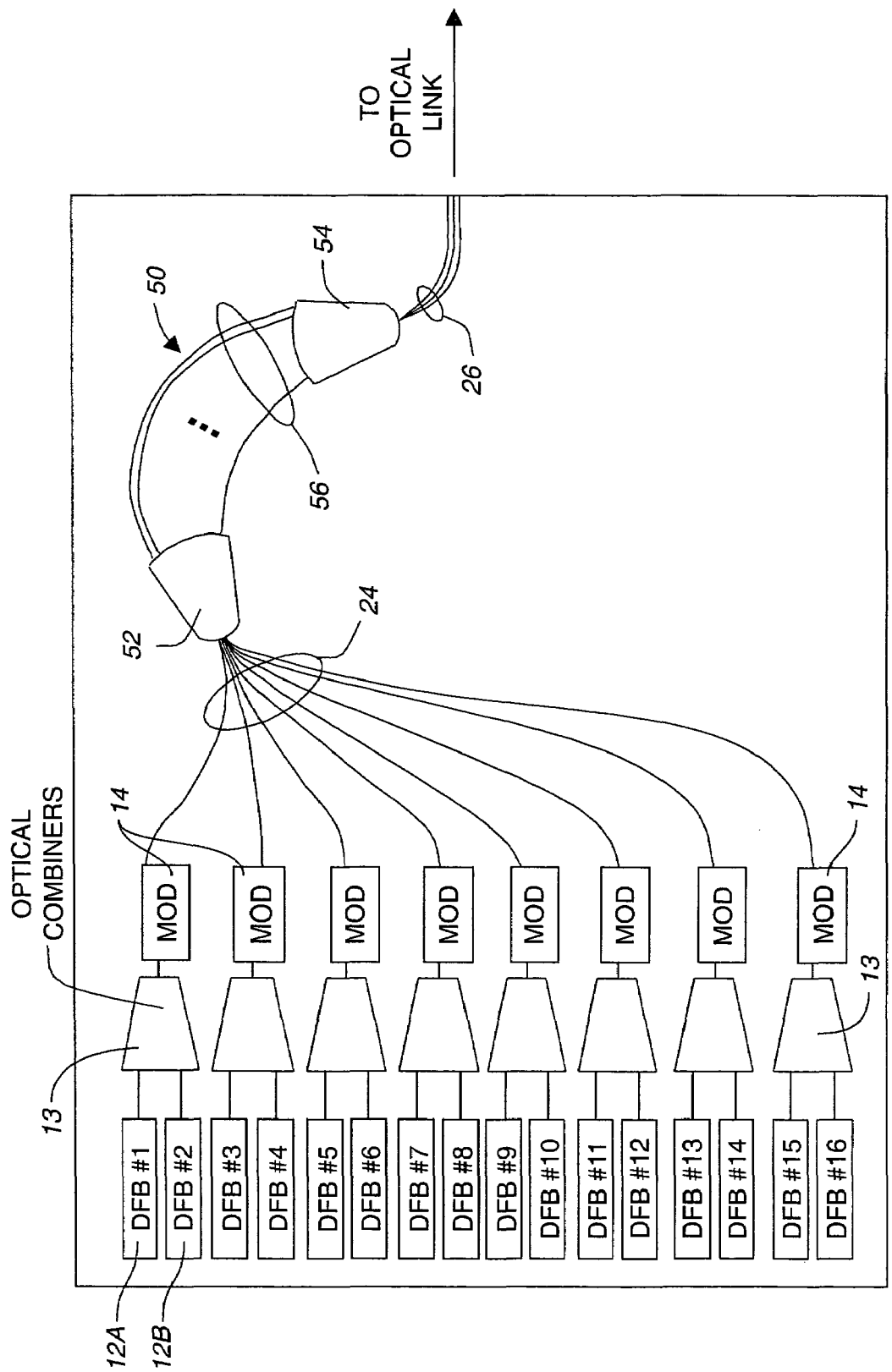
FIG._19B

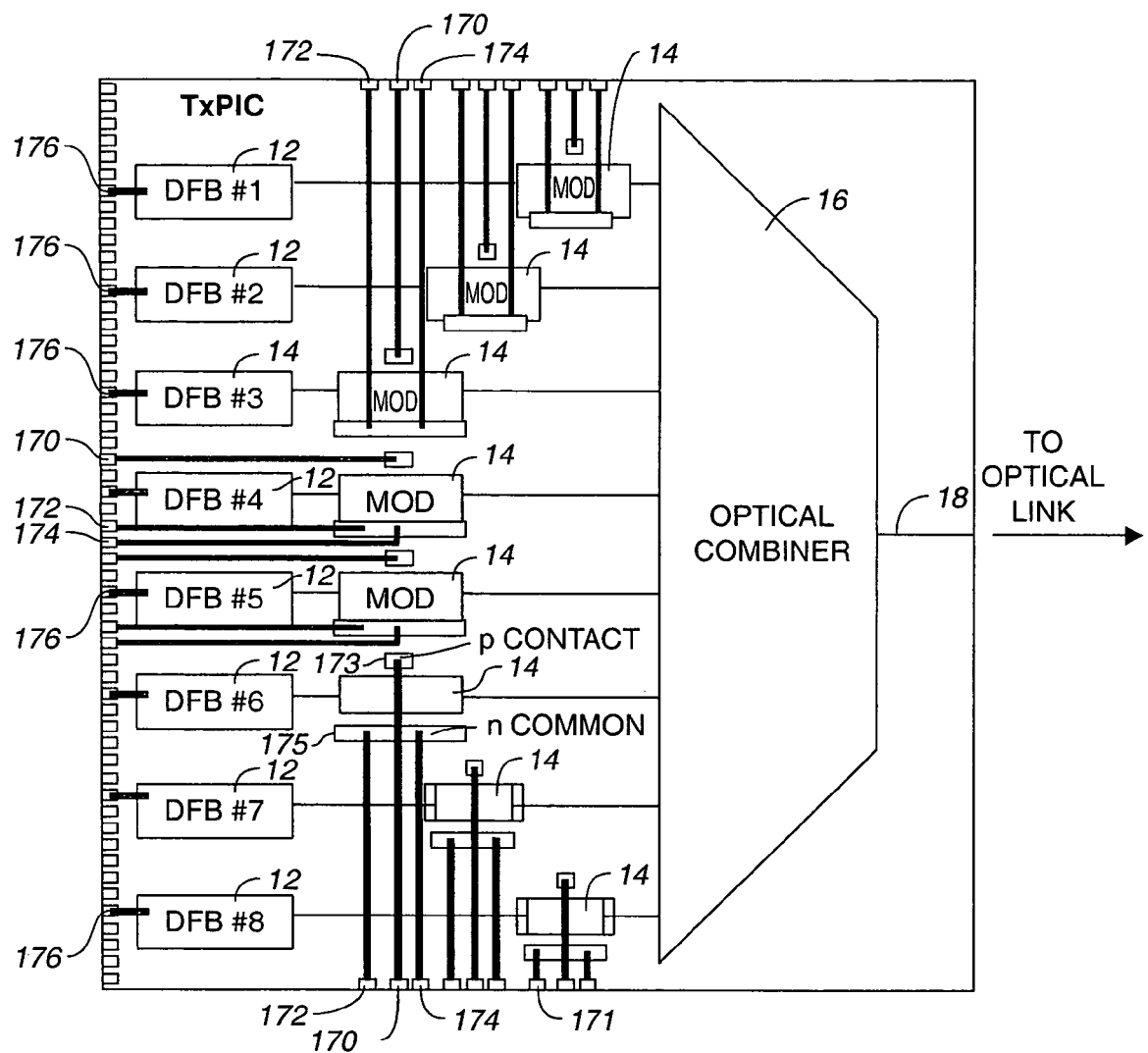
FIG._20
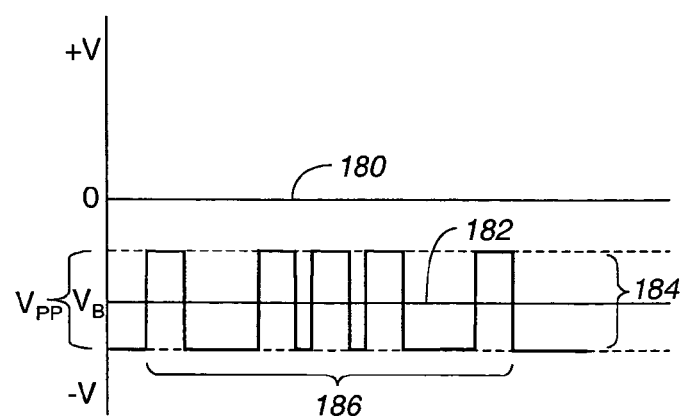
FIG._20A

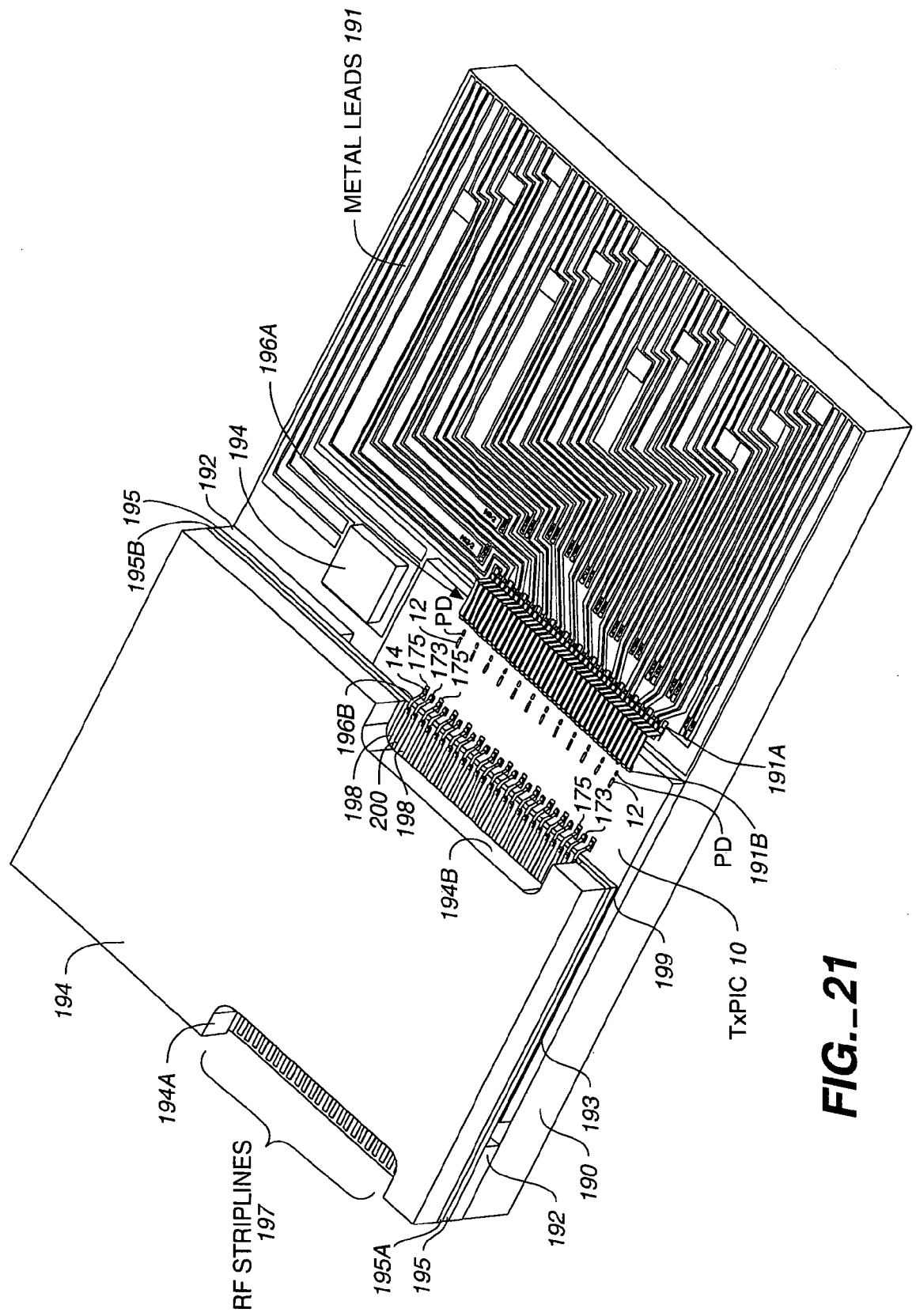

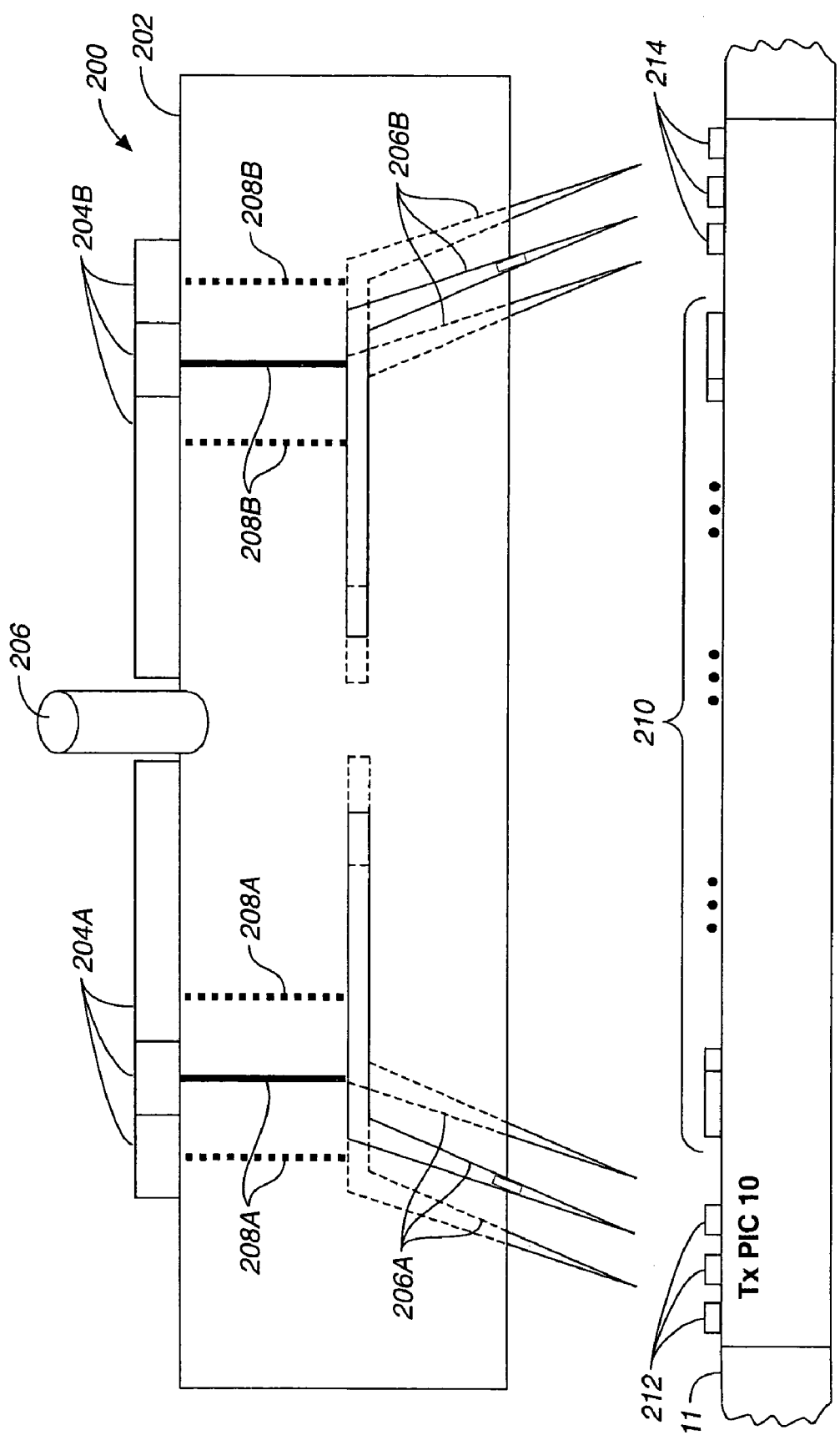
FIG._22

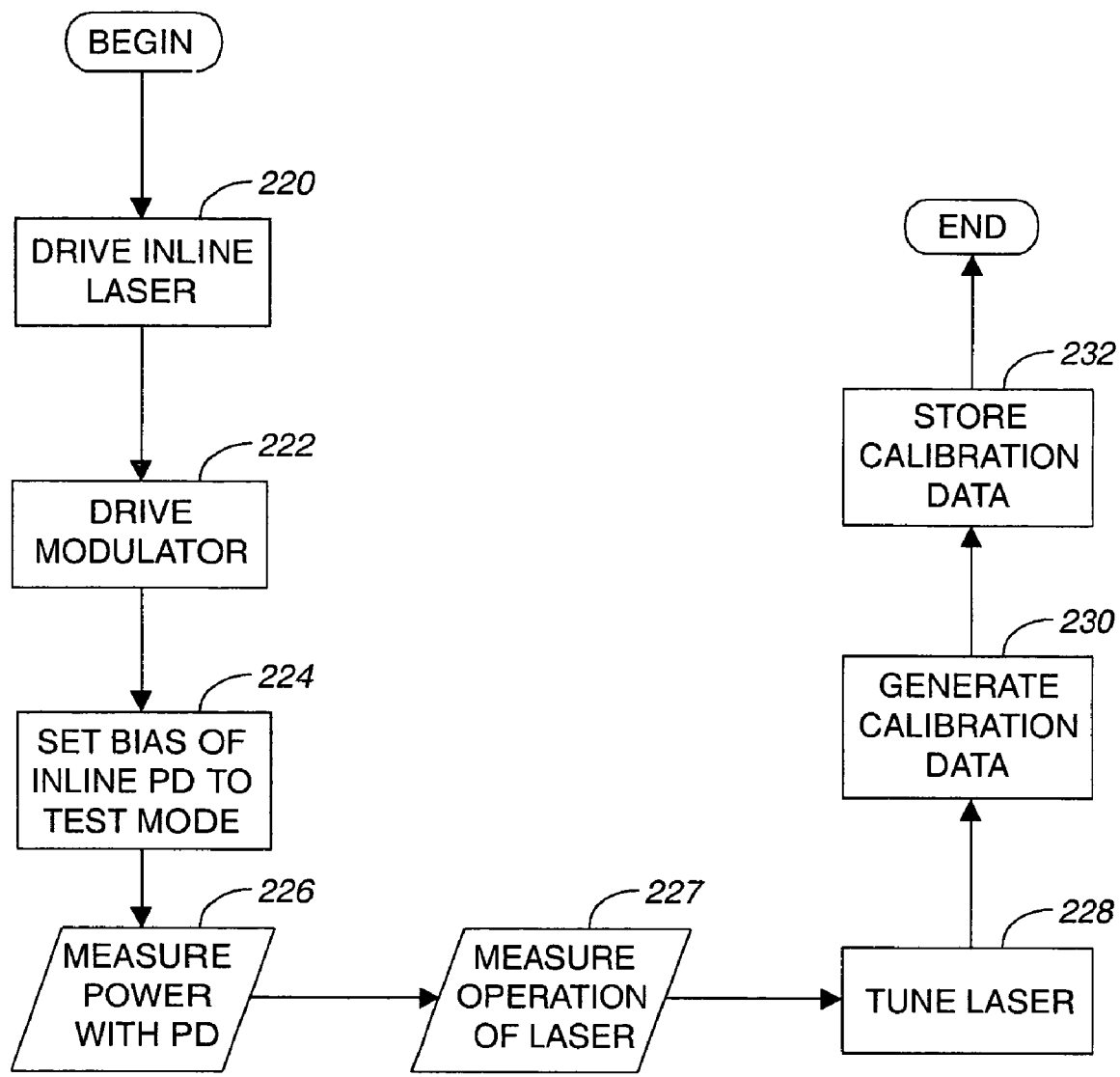
FIG._23

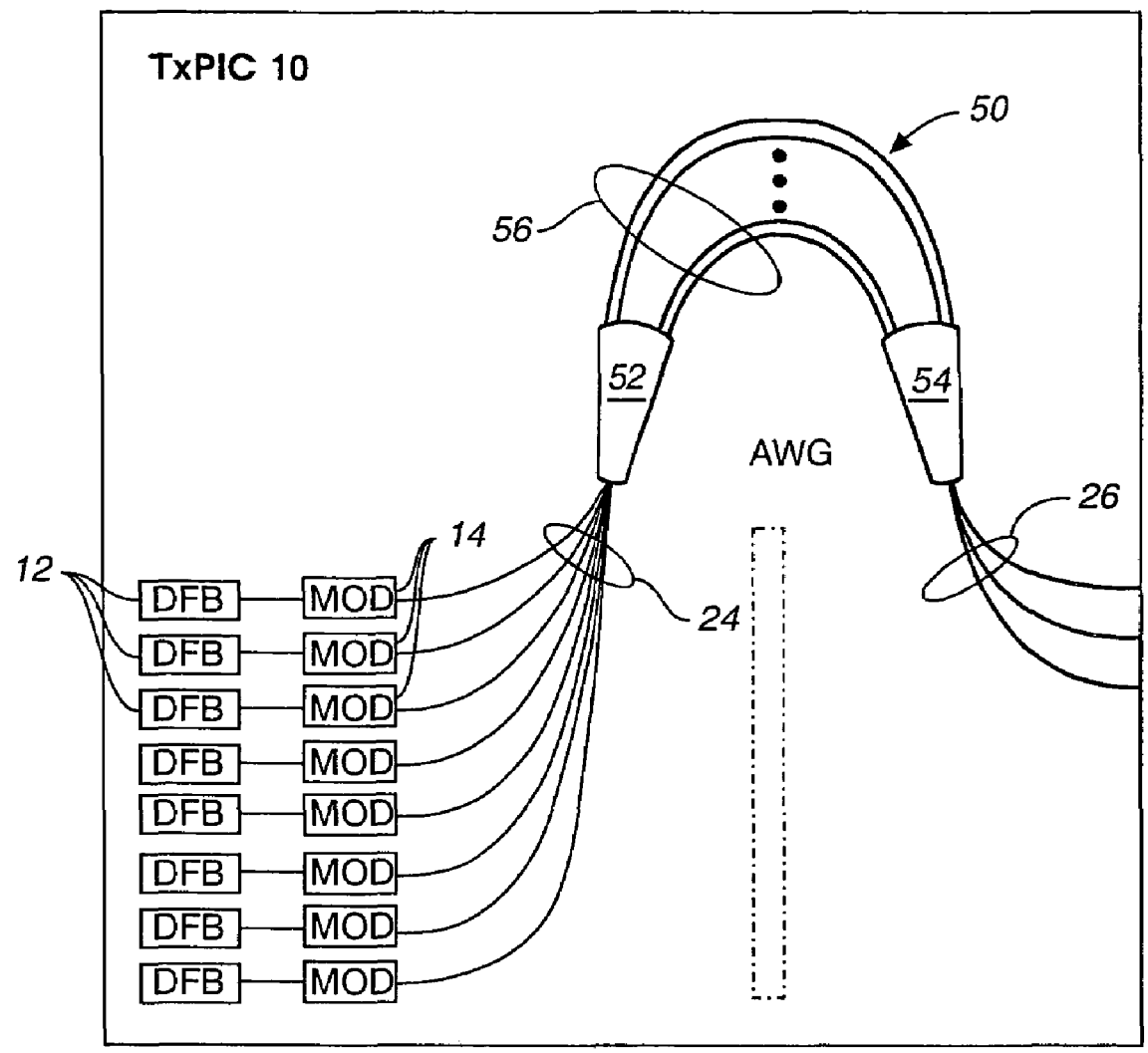
FIG._24A

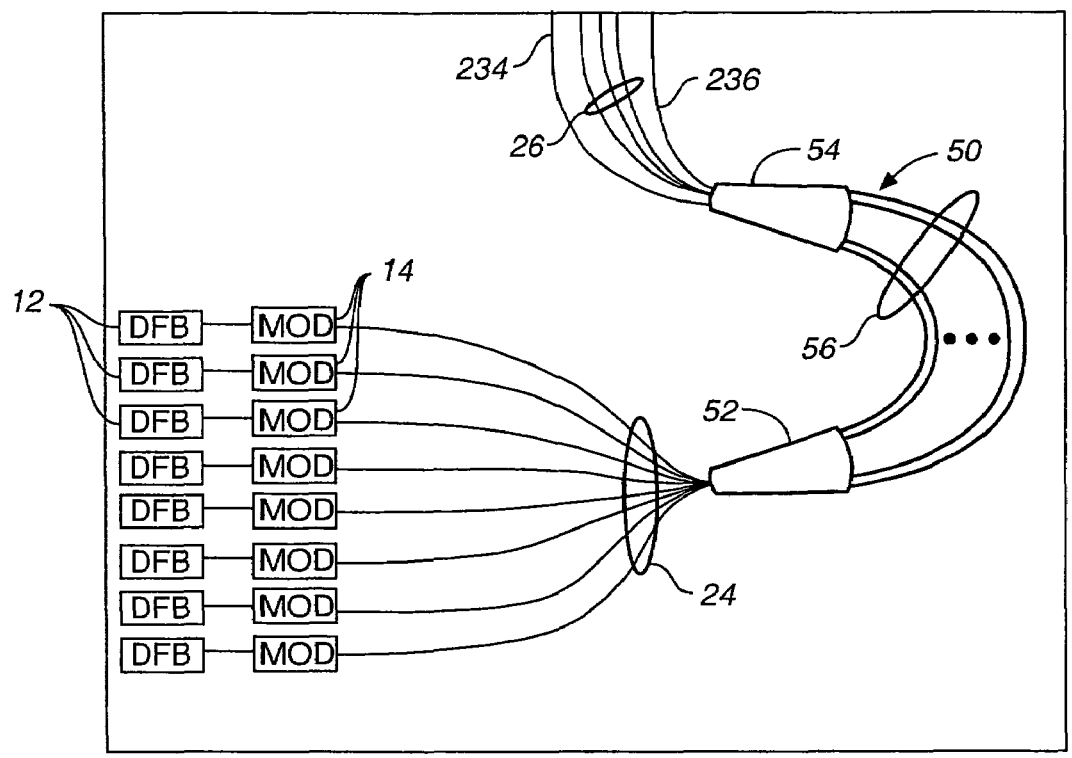
FIG._24B
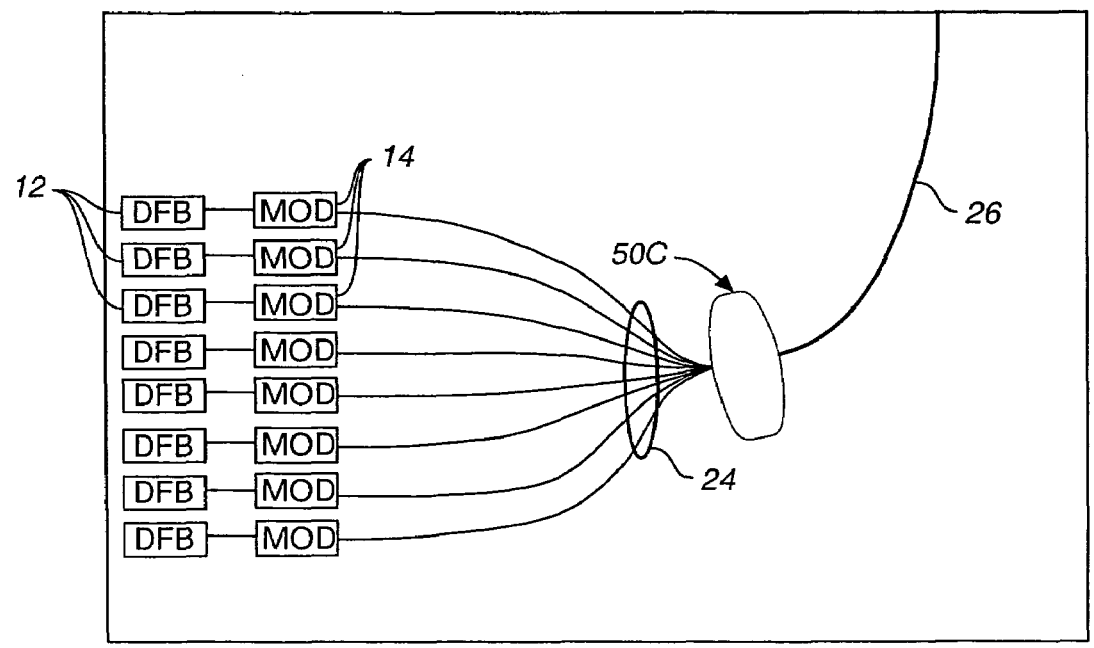
FIG._24C

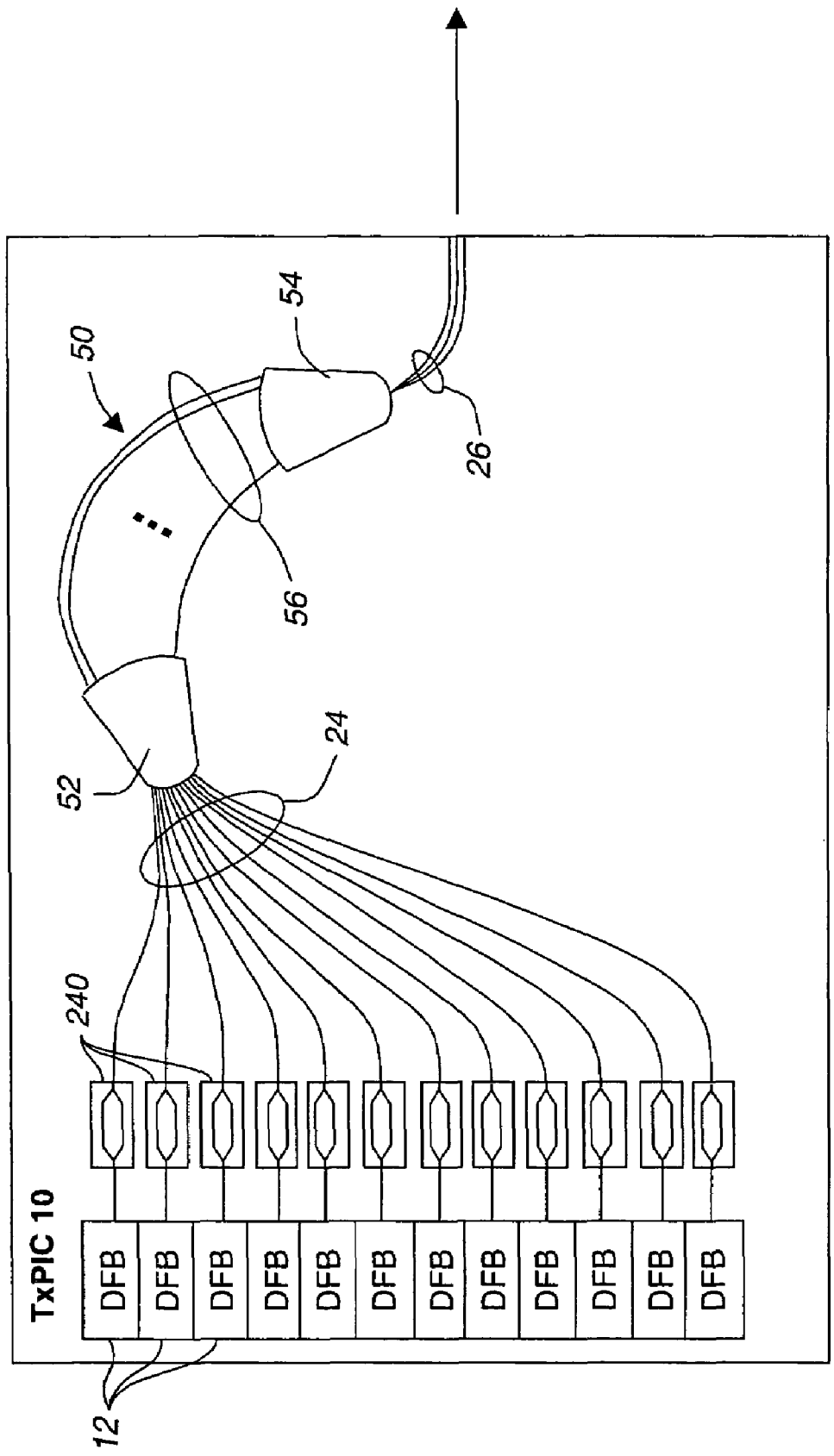
FIG._25

SUBMOUNT FOR A PHOTONIC INTEGRATED CIRCUIT (PIC) CHIP

REFERENCE TO RELATED APPLICATION

This application is a division of patent application, Ser. No. 10/317,935, filed Dec. 11, 2002 and entitled, TRANSMITTER PHOTONIC INTEGRATED CIRCUIT (TxPIC) CHIPS, which is a continuation of Ser. No. 10/267,331, filed Oct. 8, 2002 and entitled, TRANSMITTER PHOTONIC INTEGRATED CIRCUITS (TxPIC) AND OPTICAL TRANSPORT NETWORKS EMPLOYING TxPICs, which claims priority of provisional applications, Ser. No. 60/328,207, filed Oct. 9, 2001; Ser. No. 60/328,332, filed Oct. 9, 2001; Ser. No. 60/392,494, filed Jun. 28, 2002; Ser. No. 60/370,345, filed Apr. 5, 2002; Ser. No. 60/378,010, filed May 10, 2002; and Ser. No. 60/367,595, filed Mar. 25, 2002, all of which applications are owned by a common assignee, Infinera Corporation, and are incorporated herein by their reference.

BACKGROUND OF THE INVENTION

1. Field of the Invention

This invention relates generally to optical telecommunication systems and more particularly to optical transport networks employed in such systems deploying photonic integrated circuits (PICs) for wavelength division multiplexed (WDM) or dense wavelength division multiplexed (DWDM) optical networks.

2. Description of the Related Art

If used throughout this description and the drawings, the following short terms have the following meanings unless otherwise stated:

1R—Re-amplification of the information signal.
2R—Optical signal regeneration that includes signal reshaping as well as signal regeneration or re-amplification.
3R—Optical signal regeneration that includes signal retiming as well as signal reshaping as well as re-amplification.
4R—Any electronic reconditioning to correct for transmission impairments other than 3R processing, such as, but not limited to, FEC encoding, decoding and re-encoding.
A/D—Add/Drop.
APD—Avalanche Photodiode.
AWG—Arrayed Waveguide Grating.
BER— Bit Error Rate.
CD—Chromatic Dispersion.
CDWM—Cascaded Dielectric wavelength Multiplexer (Demultiplexer).
CoC—Chip on Carrier.
DBR—Distributed Bragg Reflector laser.
EDFAs—Erbium Doped Fiber Amplifiers.
DAWN—Digitally Amplified Wavelength Network.
DCF—Dispersion Compensating Fiber.
DEMUX—Demultiplexer.
DFB—Distributed Feedback laser.
DLM—Digital Line Modulator.
DON—Digital Optical Network as defined and used in this application.
EA—Electro-Absorption.
EAM—Electro-Absorption Modulator.
EDFA—Erbium Doped Fiber Amplifier.
EML—Electro-absorption Modulator/Laser.
EO—Electrical to Optical signal conversion (from the electrical domain into the optical domain).
FEC—Forward Error Correction.
GVD—Group Velocity Dispersion comprising CD and/or PMD.
ITU—International Telecommunication Union.
MMI—Multimode Interference combiner.
MPD—Monitoring Photodiode.
MZM—Mach-Zehnder Modulator.
MUX—Multiplexer.
NE—Network Element.
NF—Noise Figure: The ratio of input OSNR to output OSNR.
OADM—Optical Add Drop Multiplexer.
OE—Optical to Electrical signal conversion (from the optical domain into the electrical domain).
OEO—Optical to Electrical to Optical signal conversion (from the optical domain into the electrical domain with electrical signal regeneration and then converted back into-optical domain) and also sometimes referred to as SONET regenerators.
OEO-REGEN—OEO signal REG EN using opto-electronic regeneration.
OO—Optical-Optical for signal re-amplification due to attenuation. EDFAs do this in current WDM systems.
OOO—Optical to Optical to Optical signal conversion (from the optical domain and remaining in the optical domain with optical signal regeneration and then forwarded in optical domain).
OOO-REGEN—OOO signal REGEN using all-optical regeneration.
OSNR—Optical Signal to Noise Ratio.
PIC—Photonic Integrated Circuit.
PIN—p-i-n semiconductor photodiode.
PMD—Polarization Mode Dispersion.
REGEN—digital optical signal regeneration, also referred to as re-mapping, is signal restoration, accomplished electronically or optically or a combination of both, which is required due to both optical signal degradation or distortion primarily occurring during optical signal propagation caused by the nature and quality of the signal itself or due to optical impairments incurred on the transport medium.
Rx—Receiver, here in reference to optical channel receivers.
RxPIC—Receiver Photonic Integrated Circuit.
SDH—Synchronous Digital Hierarchy.
SDM—Space Division Multiplexing.
Signal regeneration (regenerating)—Also, rejuvenation. This may entail 1R, 2R, 3R or 4R and in a broader sense signal A/D multiplexing, switching, routing, grooming, wavelength conversion as discussed, for example, in the book entitled, "Optical Networks" by Rajiv Ramaswami and Kumar N. Sivarajan, Second Edition, Morgan Kaufmann Publishers, 2002.
SMF—Single Mode Fiber.
SML—Semiconductor Modulator/Laser.
SOA—Semiconductor Optical Amplifier.
SONET—Synchronous Optical Network.
SSC—Spot Size Converter, sometimes referred to as a mode adapter.
TDM—Time Division Multiplexing.
TEC—Thermo Electric Cooler.
TRxPIC—Monolithic Transceiver Photonic Integrated Circuit.
Tx—Transmitter, here in reference to optical channel transmitters.
TxPIC—Transmitter Photonic Integrated Circuit.
VOA—Variable Optical Attenuator.

WDM—Wavelength Division Multiplexing. As used herein, WDM includes Dense Wavelength Division Multiplexing (DWDM).

DWDM optical networks are deployed for transporting data in long haul networks, metropolitan area networks, and other optical communication applications. In a DWDM system, a plurality of different light wavelengths, representing signal channels, are transported or propagated along fiber links or along one more optical fibers comprising an optical span. In a conventional DWDM system, an optical transmitter is an electrical-to-optical (EO) conversion apparatus for generating an integral number of optical channels $\lambda_1, \lambda_2, \lambda_N$, where each channel has a different center or peak wavelength. DWDM optical networks commonly have optical transmitter modules that deploy eight or more optical channels, with some DWDM optical networks employing 30, 40, 80 or more signal channels. The optical transmitter module generally comprises a plurality of discrete optical devices, such as a discrete group or array of DFB or DBR laser sources of different wavelengths, a plurality of discrete modulators, such as, Mach-Zehnder modulators (MZMs) or electro-absorption modulators (EAMs), and an optical combiner, such as a star coupler, a multi-mode interference (MMI) combiner, an Echelle grating or an arrayed waveguide grating (AWG). All of these optical components are optically coupled to one another as an array of optical signal paths coupled to the input of an optical combiner using a multitude of single mode fibers (SMFs), each aligned and optically coupled between discrete optical devices. A semiconductor modulator/laser (SML) may be integrated on a single chip, which in the case of an electro-absorption modulator/laser (EML) is, of course, an EA modulator. The modulator, whether an EAM or a MZM, modulates the cw output of the laser source with a digital data signal to provide a channel signal which is different in wavelength from each of the other channel signals of other EMLs in the transmitter module. While each signal channel has a center wavelength (e.g., 1.48 µm, 1.52 µm, 1.55 µm, etc.), each optical channel is typically assigned a minimum channel spacing or bandwidth to avoid crosstalk with other optical channels. Currently, channel spacings are greater than 50 GHz, with 50 GHz and 100 GHz being common channel spacings.

An optical fiber span in an optical transport network may provide coupling between an optical transmitter terminal and an optical receiver terminal. The terminal traditionally is a transceiver capable of generating channel signals as well as receiving channel signals. The optical medium may include one or more optical fiber links forming an optical span with one or more intermediate optical nodes. The optical receiver receives the optical channel signals and converts the channel signals into electrical signals employing an optical-to-electrical (OE) conversion apparatus for data recovery. The bit error rate (BER) at the optical receiver for a particular optical channel will depend upon the received optical power, the optical signal-to-noise ratio (OSNR), non-linear fiber effects of each fiber link, such as chromatic dispersion (CD) and polarization mode dispersion (PMD), and whether a forward error correction (FEC) code technique was employed in the transmission of the data.

The optical power in each channel is naturally attenuated by the optical fiber link or spans over which the channel signals propagate. The signal attenuation, as measured in dB/km, of an optical fiber depends upon the particular fiber, with the total loss increasing with the length of optical fiber span.

As indicated above, each optical fiber link typically introduces group velocity dispersion (GVD) comprising chromatic dispersion (CD) and polarization mode dispersion (PMD). Chromatic dispersion of the signal is created by the different frequency components of the optical signal travel at different velocities in the fiber. Polarization mode dispersion (PMD) of the signal is created due to the delay-time difference between the orthogonally polarized modes of the signal light. Thus, GVD can broaden the width of an optical pulse as it propagates along an optical fiber. Both attenuation and dispersion effects can limit the distance that an optical signal can travel in an optical fiber and still provide detectable data at the optical receiver and be received at a desired BER. The dispersion limit will depend, in part, on the data rate of the optical channel. Generally, the limiting dispersion length, L, is modeled as decreasing inversely with $B^2$, where B is the bit rate.

The landscape of optical transport networks has change significantly over the past ten years. Prior to this time, most long haul telecommunication networks were generally handled via electrical domain transmission, such as provided through wire cables, which is bandwidth limited. Telecommunication service providers have more recently commercially deployed optical transport networks having vastly higher information or data transmission capability compared to traditional electrical transport networks. Capacity demands have increased significantly with the advent of the Internet. The demand for information signal capacity increases dramatically every year.

In a conventional long haul DWDM optical network, erbium doped fiber amplifiers (EDFAs) may be employed at intermediate nodes in the optical span to amplify attenuated optical channel signals. Dispersion compensation devices may also be employed to compensate for the effects of fiber pulse dispersion and reshape the optical pulses approximately to their original signal shape.

As previously indicated, a conventional DWDM optical network requires a large number of discrete optical components in the optical transmitter and receiver as well as at intermediate nodes along the optical link between the transmitter terminal and the receiver terminal. More particularly, each optical transmitter typically includes a semiconductor laser source for each optical channel. Typically a packaged module may include a semiconductor laser and a monitoring photodiode (MPD) to monitor the laser source wavelength and intensity and a heat sink or thermal electric cooler (TEC) to control the temperature and, therefore, wavelength of the laser source. The laser sources as well as the optical coupling means for the output light of the laser source to fiber pigtail, usually involving an optical lens system, are all mounted on a substrate, such as a silicon microbench. The output of the laser pigtail is then coupled to an external electro-optical modulator, such as a Mach-Zehnder lithium niobate modulator. Alternatively, the laser source itself may be directly modulated. Moreover, different modulation approaches may be employed to modulate the external modulator, such as dual tone frequency techniques.

The output of each modulator is coupled via an optical fiber to an optical combiner, such as, an optical multiplexer, for example, a silica-based thin film filter, such as an array waveguide grating (AWG) fabricated employing a plurality of silicon dioxide waveguides formed in a silica substrate. The fibers attached to each device may be fusion spliced together or mechanically coupled. Each of these device/fiber connections introduces a deleterious, backward reflection into the transmitter, which can degrade the channel signals. Each optical component and fiber coupling also typically introduces an optical insertion loss.

Part of the cost of the optical transmitter is associated with the requirement that the optical components also be optically compatible. For example, semiconductor lasers typically produce light output that has a TE optical mode. Conventional optical fibers typically do not preserve optical polarization. Thus, optical fiber pigtails and modulators will transmit and receive both transverse electric (TE) and transverse magnetic (TM) polarization modes. Similarly, the optical combiner is polarization sensitive to both the TE and TM modes. In order to attenuate the effects of polarization dispersion, the modulator and the optical combiner are, therefore, designed to be polarization insensitive, increasing their cost. Alternatively, polarization preserving fibers may be employed for optically coupling each laser source to its corresponding modulator and for coupling each modulator to the optical combiner. Polarization preserving fibers comprise fibers with a transverse refractive index profile designed to preserve the polarization of an optical mode as originally launched into a fiber. For example, the fiber core may be provided with an oblong shape, or may be stressed by applying a force to the fiber to warp the refractive index of the waveguide core along a radial or cross-sectional lateral direction of the fiber, such as a PANDA TM fiber. However, polarization preserving fibers are expensive and increase packaging costs since they require highly accurate angular alignment of the fiber at each coupling point to an optical component in order to preserve the initial polarization of the channel signal.

A conventional optical receiver also requires a plurality of discrete optical components, such as an optical demultiplexer or combiner, such as an arrayed waveguide grating (AWG), optical fibers, optical amplifiers, and discrete optical detectors as well as electronic circuit components for handling the channel signals in the electrical domain. A conventional optical amplifier, such as an EDFA, has limited spectral width over which sufficient gain can be provided to a plurality of optical signal channels. Consequently, intermediate OEO nodes will be required comprising a demultiplexer to separate the optical channel signals, photodetector array to provide OE conversion of the optical signals into the electrical domain, 3R processing of the electrical channel signals, EO conversion or regeneration of the processed electrical signals, via an electro-optic modulator, into optical signals, optical amplifiers to amplify the channel signals, dispersion compensators to correct for signal distortion and dispersion, and an optical multiplexer to recombine the channel signals for propagation over the next optical link.

There is considerable interest in DWDM systems to increase both the data rate of each signal channel as well as the number of channels, particularly within the gain bandwidth of the EDFA. However, increasing the channel data rate necessitates increasing the number of intermediate nodes along the optical path to provide the required signal dispersion compensation and amplification. Increasing the number of channels requires precise control of channel assignment and more precise control over signal dispersion, which dramatically increases the complexity and cost of the fiber-optic components of the system. A further complication is that many pre-existing optical networks use different types of optical fibers in the different optical links of the optical network having, therefore, different dispersion effects over different fiber lengths. In some cases, the wavelengths of the optical channels generated at the optical transmitter may not be optimal for one or more optical links of the optical span.

What is desired are improved techniques to provide DWDM optical network services through improved, integrated optical network components and systems.

OBJECTS OF THE INVENTION

It is an object of this invention to provide an optical transmitter or transceiver that comprises a PIC with integrated active and passive components adapted to generate and/or receive optical channel signals approximately conforming to a standardized wavelength grid, such as the ITU wavelength grid.

It is another object of the present invention to provide an integrated optical component where the optical transmitter, optical receiver or optical transceiver is an integrated photonic integrated circuit (PIC).

It is another object of this invention to provide a photonic integrated circuit (PIC) comprising an array of modulated sources, each providing a modulated signal output at a channel wavelength different from the channel wavelength of other modulated sources and a wavelength selective combiner having an input optically coupled to received all the channel signal outputs from the modulated sources and provide a combined output signal.

It is a further object of the present invention to provide an integrated optical component where the optical transmitter or optical transceiver comprises an integrated photonic integrated circuit (PIC) to eliminate the required optical alignment and optical coupling of discrete optical components via optical waveguide devices or optical fibers.

Another object of this invention is the provision of a TxPIC chip that includes multiple signal channels where each channel comprises a modulated source of different wavelengths where all the wavelengths are approximated to a standardized wavelength grid, with their channel signal outputs coupled to an optical combiner to provide at its output a combined channel signal.

It is a particular object with respect to this invention to provide a TxPIC chip with a substrate suspended over the chip to provide for electrical connection to some of the electro-optic components or elements on the chip.

SUMMARY OF THE INVENTION

According to this invention, a photonic integrated circuit (PIC) chip with a plurality of electro-optic components formed on a major surface of the chip and a submount that includes a substrate that extends over the major surface of the chip forming an air gap between the substrate and the major surface, the substrate to support electrical leads for electrical connection to some of the electro-optic components on the chip major surface.

According to further aspect of this invention, a chip module comprises a monolithic photonic integrated circuit (PIC) chip which includes at least one array of electro-optic components integrated on the chip. A submount for mounting the chip comprises a first substrate formed on the submount and surrounding at least a portion of the chip. A second substrate is supported on the first substrate and is suspended at least, in part, over the chip forming an air gap between the chip and a bottom surface of the second substrate. A plurality of metal lines formed on a surface of the second substrate and extend over the chip for electrical connection from the second substrate to the chip.

A feature of this invention is a TxPIC chip platform that includes a submount containing contact leads from the TxPIC chip to be elevated over and spatially separated from the TxPIC chip.

A photonic integrated circuit chip or TxPIC chip comprises an integrated array of modulated sources which may be an array of directly modulated laser sources or an integrated array of laser sources and electro-optic modulators. The modulated sources have their outputs coupled to inputs of an integrated optical combiner. For example, the laser array may be DFB lasers or DBR lasers, preferably the former, which, in one embodiment may be directly modulated. The electro-optical modulator may be comprised of electro-absorption (EA) modulators (EAMs) or Mach-Zehnder modulators (MZMs), preferably the former. The optical combiner may be a free space combiner or a wavelength selective combiner or multiplexer, where examples of the free space combiner are a power coupler such as a star coupler and a multi-mode interference (MMI) coupler, and examples of a wavelength selective combiner are an Echelle grating or an arrayed waveguide grating (AWG), preferably the latter multiplexer because of its lower insertion loss. This disclosure discloses many different embodiments of the TxPIC, applications of the TxPIC in an optical transport network and wavelength stabilization or monitoring of the TxPIC.

The TxPIC chip in its simplest form comprises a semiconductor laser array, an electro-optic modulator array, an optical combiner and an output waveguide. The output waveguide may include a spot size converter (SSC) for providing a chip output that is better match to the numerical aperture of the optical coupling medium, which is typically an optical fiber. In addition, a semiconductor optical amplifier (SOA) array may be included in various points on the chip, for example, between the modulator array and the optical combiner; or between the laser array and the modulator array. In addition, a photodiode (PD) array may be included before the laser array; or between the laser array and the modulator array; or between an SOA array, following the laser array, and the modulator array, or between the modulator array and the optical combiner; or between an SOA array, following the modulator array, and the optical combiner. Also, an SOA may be provided in the output waveguide, preferably a laser amplifier, for example, a GC-SOA.

A preferred form of the TxPIC chip may be comprise an array of modulated sources comprising a DFB laser array and an EAM array, together with an AWG multiplexer and possibly with some on-chip monitoring photodiodes, such as PIN photodiodes or avalanche photodiodes (APDs).

Other objects and attainments together with a fuller understanding of the invention will become apparent and appreciated by referring to the following description and claims taken in conjunction with the accompanying drawings.

BRIEF DESCRIPTION OF THE DRAWINGS

In the drawings wherein like reference symbols refer to like parts.

FIG. 1 is a schematic block diagram of an example of a single channel in a TxPIC chip.

FIG. 2 is another schematic block diagram of another example of a single channel in a TxPIC chip.

FIG. 3 is another schematic block diagram of a further example of a single channel in a TxPIC chip.

FIG. 4 is a cross-sectional view of a first embodiment of a monolithic TxPIC chip illustrating a signal channel waveguide through an integrated DFB laser, EAM modulator and an optical combiner.

FIG. 5 is a cross-sectional view of a second embodiment of a monolithic TxPIC chip illustrating a signal channel waveguide through an integrated DFB laser, EAM modulator and an optical combiner.

FIG. 6 is a cross-sectional view of a third embodiment of a monolithic TxPIC chip illustrating a signal channel waveguide through an integrated DFB laser, EAM modulator, semiconductor optical amplifier (SOA) and an optical combiner.

FIG. 7A is a schematic diagram of the plan view of a monolithic TxPIC adapted also to receive data from an optical link.

FIG. 7B is a schematic diagram of a modified version of the monolithic TxPIC of FIG. 7A.

FIG. 7C is a schematic diagram of a further modified version of the monolithic TxPIC of FIG. 7A.

FIG. 8 is a schematic diagram of a plan view of a monolithic TxPIC for utilizing an on-chip photodetector to monitor facet reflectivity during the antireflection (AR) coating process.

FIG. 9 is a schematic diagram of a plan view of a first type of monolithic transceiver (TRxPIC) with interleaved optical transmitter and receiver components.

FIG. 10 is a schematic diagram of a side view of a second type of monolithic transceiver (TRxPIC) useful for 3R regeneration and flip chip coupled to a submount with control electronic semiconductor chip components for operating the TRxPIC.

FIG. 11 is a schematic diagram of a plan view of a monolithic TxPIC with external monitoring photodiodes (MPDs) for monitoring the wavelength and/or intensity of the laser sources.

FIG. 12 is a schematic diagram of a plan view of a monolithic TxPIC with detachable integrated MPDs and heater sources provided for each laser source and the optional SOAs, and for the optical combiner.

FIG. 13 is a schematic diagram of a plan view of a monolithic TxPIC with MPD coupled between each laser source and electro-optic modulator to monitor the output intensity and/or wavelength of each laser source.

FIG. 14 is a schematic diagram of a plan view of a monolithic TxPIC with MPD coupled between each electro-optic modulator and the optical combiner to monitor the output intensity and/or chirp parameter of each modulator.

FIG. 15 is a schematic diagram of a plan view of a monolithic TxPIC with MPD coupled to a tapped portion of the multiplexed signal output of the TxPIC to monitor the signal channel intensity and wavelength.

FIG. 16 is a schematic diagram of a plan view of a monolithic TxPICs as-grown in an InP wafer.

FIG. 17 is a flowchart of a method for generating calibration data during manufacture to store calibrated data in adjusting the bias of the laser sources, modulators and SOAs, if present, in the TxPIC and thereafter adjust the wavelength of the channels to be set at the predetermined wavelengths after which the SOAs, if present, may be further adjusted to provide the appropriate output power.

FIG. 18 is a schematic diagram of a plan view of another embodiment of a TxPIC chip where additional SMLs are formed at the edges of the InP wafer or, more particularly, to the edges of the TxPIC chip or die in order to maximize chip yield per wafer.

FIG. 19A is a schematic diagram of a plan view of another embodiment of a TxPIC chip where additional redundant SML sets are formed between SML sets that are to be deployed for signal channel generation on the chip and used to replace inoperative SMLs, either at the time of manufacture or later in the field, thereby maximizing chip yield per wafer.

FIG. 19B is a schematic diagram of a plan view of another embodiment of a TxPIC chip where additional redundant laser sources are provided for each signal channel on the chip so that if one of the pair of laser sources is inoperative, either at the time of manufacture or later in the field, the other source can be placed in operation, thereby maximizing chip yield per wafer.

FIG. 20 is a schematic diagram of a plan view of another embodiment of a TxPIC chip illustrating one embodiment of the provision of RF conductive lines employed for modulating the electro-optic modulators on the chip.

FIG. 20A is a graphic illustration of how the modulators of FIG. 20, or any other modulator in other embodiments, are operated via negative bias and peak-to-peak swing.

FIG. 21 is a perspective view of a schematic diagram of the bias contacts and bonding wire or tape for electro-optic components and the RF lines and contacts for the electro-optic modulators.

FIG. 22 is a schematic side view of a probe card with multiple probes inline with contact pad on a TxPIC chip to provide PIC chip testing at the wafer level or after burn-in for reliability screening prior to final chip fabrication.

FIG. 23 is flowchart of a method for wafer level testing of laser source output power using integrated PDs which may later be rendered optically transparent.

FIG. 24 is a schematic diagram of a plan view of another embodiment of a TxPIC chip illustrating the geometric arrangement of optical components to insure that stray light from the SML components do not interfere with the output waveguides of the optical combiner.

FIG. 25 is a schematic diagram of a plan view of another embodiment of a TxPIC chip deploying Mach-Zehnder Modulators (MZMs) in the TxPIC chip.

DETAILED DESCRIPTION OF THE INVENTION

Reference is now made to FIGS. 1A and 1B which illustrate, in block form, an optical path on a monolithic TxPIC chip 10 showing plural active and passive optically coupled and integrated components. What is shown in diagrammatic form is one channel of such a chip. Both FIGS. 1A and 1B show modulated sources coupled to an optical combiner. Shown in FIG. 1A is one of an array of sources comprising a directly modulated semiconductor laser 12 integrated with an optical combiner 16 having an optical output waveguide 18 to take a combined channel signal off-chip. Shown in FIG. 1B is one of an array of sources comprising a semiconductor laser 12 optically coupled to one of an array of modulators comprising an electro-optic modulator 14 optically coupled to an input of an optical combiner 16 with the output of combiner 16 coupled to an optical output waveguide 18. There are plural optical paths on chip 10 of semiconductor laser 12 and electro-optic modulator 14, also in combination referred to as an SML, these SMLs respectively coupled to inputs of optical combiner 16. This is the basic monolithic, generic structure of a TxPIC chip 10 for use in an optical transmitter module, also referred to by the applicants herein as a DLM (digital line module).

The semiconductor laser 12 may be a DFB laser or a DBR laser. While the later has a broader tuning range, the former is more desirable from the standpoint of forming an array of DFB lasers 12 that have peak wavelengths, which are created in MOCVD employing SAG (selective area growth) techniques to approximate a standardized wavelength grid, such as the ITU grid. There has been difficulty in the integration of DFB lasers with an optical combiner but the careful deployment of SAG will provide a TxPIC 10 that has the required wavelength grid. Thus, the optical SML paths, mentioned in the previous paragraph, are modulated data signal channels where the modulated channel signals are respectively on the standardized grid. Electro-optic modulators 14 may be EAMs (electro-absorption modulators) or MZMs (Mach-Zehnder modulators). Optical combiner 18 may be comprised of a star coupler, a MMI coupler, an Echelle grating or an arrayed waveguide grating (AWG). one of an array of sources. To be noted is that there is an absence in the art, at least to the present knowledge of the inventors herein, of the teaching and disclosure of an array of modulated sources and wavelength selective optical multiplexer, e.g., such as an arrayed waveguide grating (AWG) or Echelle grating In this disclosure, a wavelength selective multiplexer or combiner is defined as one that has less than 1/N insertion loss wherein N is the number of modulated sources being multiplexed. One principal reason is that it is difficult to fabricate, on a repeated basis, an array of lasers with a wavelength grid that simultaneously matches the wavelength grid of the a wavelength selective combiner (e.g., an AWG). The AWG is preferred because it can provide a lower loss multiplexing structure. Additionally, an AWG may provide a narrow passband for grid wavelengths of lasers such as DFB lasers.

In FIG. 2, there is shown a further embodiment of a monolithic TxPIC 10 chip. The TxPIC chip here is the same as that shown in FIG. 1B except there is an additional active component in the form of semiconductor optical amplifier (SOA) 20. Due to insertion losses in the optical components on the chip 10, particularly at points of their coupling, an on-chip amplifier 20 may be included in each EML optical path to boost the output channel signals from modulators 14. An advantage of SOAs on TxPIC chips 10 compared to their deployment on RxPIC chips is the relaxation of the optical signal to noise ratio (OSNR) on the TxPIC SOAs compared to their employment in RxPIC SOAs, SOAs deployed on RxPIC chips are positioned at the input of the chip to enhance the gain of the incoming multiplexed channel signal and is dominated by ASE generated from the SOA which can effect the proper detection of channel signal outputs. This is not as significant a problem in TxPIC chips which renders their usage in TxPIC chips as more acceptable in design freedom. As a result, the noise figure design criteria are relaxed in the transmitter side, compared to the receiver side and being sufficient for 100 km optical fiber link. Thus, OSNR limited optical devices can drive the architecture and this has not been recognized by those skilled in the art. More details of RxPIC chips can be found in U.S. patent application, Ser. No. 267,304, filed Oct. 8, 2002 and published on Feb. 19, 2004 as Pub. No. US2004/0033004A1 incorporated herein by its reference.

It should be noted that the peak wavelengths of the SOAs 20 on a TxPIC chip 10, such as, for example, SOAs 20 following each modulator 14 of each channel on a N channel TxPIC chip 10, should preferably have a peak wavelength slightly longer, such as, for example, in the range of 10 nm to 80 nm or preferably in the range of 30 nm to 60 nm, than its corresponding semiconductor laser, such as a DFB laser, in order to compensate for band-filling effects in SOAs 20, which effectively shifts the gain peak of an SOA 14 to shorter wavelengths when the SOA is placed into operation.

The amount of wavelength shift depends upon the designed bias point of the SOA. A preferred way to accomplish a different peak wavelength in SOAs 20, compared to its corresponding semiconductor DFB laser, is to change the size or thickness of the active region of SOA 20 to change its built-in peak wavelength through the use of SAG or, alternatively, through multiple layer regrowths. The use of SAG in fabrication of chip 10 is discussed in more detail in U.S. patent application, Ser. No. 267,346, filed Oct. 8, 2002 and published on May 1, 2003 as Pub. No. US2003/0081878A1, which is incorporated herein by its reference.

Also, attention should be drawn to the optimization of active and active optical component spacing relative to substrate thickness to minimize thermal cross-talk between active optical components on TxPIC chip 10. Inter-component spacing of active optical components, such as DFB lasers 12, modulators 14 and SOAs 20, is, in part, driven by thermal crosstalk, e.g., changes in temperature operation of these components that affect the optical characteristics of neighboring active optical components, such as their wavelength or their bias point. Therefore, these active optical components should be sufficiently spaced in order to minimize thermal crosstalk affecting neighboring component operation. Component separation also important with respect to with substrate thickness. Ideally, the thickness of the substrate should be kept to a maximum in order to minimize wafer breakage, particularly in the case of highly brittle InP wafers, as well as breakage at the chip level during handling or processing. On the other hand, the substrate should not be too thick rendering cleaving yields lower or resulting in excess heating and thermal crosstalk due to thicker substrates. As an example, for a 500 μm thick InP substrate, a preferred inter-component separation is in the range of about 200 μm to about 600 μm.

Reference is now made to FIG. 3 which shows, in block form, a TXPIC chip 10 similar to the chip shown in FIG. 1 except the output waveguide 18A from the optical combiner includes in its path an SOA. Thus, the multiplexed channel signals may be on-chip amplified prior to their launching on an optical transport medium such as an optical fiber link. This chip output amplifier may be preferred as a gain-clamped SOA which is discussed in more detail in connection with FIG. 9.

Reference is now made to cross section views of various representative embodiments of a TxPIC chip 10. These cross-sectional views are not to scale, particularly in reference to the active waveguide core 42 of the disclosed semiconductor chips. Chips 10 are made from InP wafers and the layers are epitaxially deposited using an MOCVD reactor and specifically comprise DFB lasers 12, EAMs. As seen in the cross-sectional view of FIG. 4, there is shown an optical EML path and optical combiner of TxPIC chip 10, comprising an InP substrate 32, such as n-InP or InP:Fe, followed by a cladding layer 34, a waveguide layer 36, a spacer layer 38 of n-InP, followed by grating layer 40. Grating layer 40 includes a grating (not shown) in the section comprising DFB laser 12, as is well known in the art, having a periodicity that provides a peak wavelength on a standardized wavelength grid. Grating layer 40 is followed by layer 41 of n-InP, multiple quantum well region of wells and barriers employing a quaternary (O) such as InGaAsP or AlInGaAs. These quaternaries are hereinafter collectively referred to as "Q". These layer are deposited deploying SAG using a mask to form the individual DFB bandgaps of their active regions as well as the bandgaps for the individual EAMs 14 so that wavelengths generated by the DFB laser 12 will be transparent to the individual EAMs 14. Also, the wavelength of the field of combiner 18 will be shorter than that of the EAMs 14. As an example, the longest wavelength for a DFB array may be 1590 nm, its EAM will have a wavelength of 1520 nm and the field of optical combiner 18 will have a wavelength of 1360 nm.

The Q active region 42 and the waveguide core 36 layer extend through all of the integrated optical components. If desired, the laser, and the SOA 20, if present, can be composed of a different active layer structure than the region of the EAM 14. In this embodiment, the Q waveguiding layer 36 provides most of the optical confinement and guiding through each section of the chip 10.

The chip 10 is completed with the growth of NLD-InP layer 44, cladding layer 46, which is either n-InP or NID-InP, and contact layer 48 comprising $p^{++}$-InGaAs. Cladding layer 46 as well as its overlying contact layer portion is selectively etch away either over the EMLs or over the field of optical combiner 18 and regrown so that the partition results in p-InP layer 46A and p++-InGaAs layer 48A in regions of DFB lasers 12 and EAMs 14 and a NID-InP layer 46B and a passivation layer 48B in region of the field of optical combiner 18. The reason for this etch and regrowth is to render the optical combiner field 18 non-absorbing to the optical channel signals propagating thought this optical passive device. More is said and disclosed relative to this matter in U.S. application, Ser. No. 10/267,346, incorporated herein by its reference.

Chip 10 is completed with appropriate contact pads or electrodes, the p-side electrodes 44 and 46 shown respectively for DFB laser 12 and EAM 14. If substrate 32 is semiconductive, i.e., n-InP, then an n-side electrode is provided on the bottom substrate 32. If substrate 32 is insulating, i.e., InP:Fe, the electrical contact to the n-side is provided through a via (not shown) from the top of the chip down to n-InP layer 34. The use of a semi-insulating substrate 32 provides the advantage of minimizing electrical cross-talk between optical components, particularly active electrical components in aligned arrays, such as DFB lasers 12 and EAMs 14. The inter-component spacing between adjacent DFB laser 12 and EAMs 14 be about 250 μm or more to minimize cross-talk at data rates of 10 Gbit per sec.

Reference is now made to FIG. 5 which is the same as FIG. 4 except that Q waveguide layer 36 is epitaxially positioned above active region 42 rather than below this region as shown in FIG. 4.

Reference is now made to FIG. 6 which is similar to FIG. 4 except that, in addition, discloses an integrated optical amplifier comprising SOA 20 with its p-side contact pad 49 and a spot size converter 22 formed in the waveguide 18 from the optical combiner 18. To be noted is that the selective area growth (SAG) techniques may be employed to vary the epitaxial growth rate along the regions of the PIC to vary the thickness of quantum well active layers longitudinally along the optical EML paths of these optical active components. For example, in the case here, layers 42A in the active region 41 of EAM 14 are made thinner compared to the DFB and optical combiner regions so that the optical mode experiences tighter confinement during modulation with no probable creation of multi-modes. Thus on either side of EAM 14, there are mode adaptors 14× and 14Y formed through SAG that respectively slightly tighten the confinement of the optical mode and permit slight expansion of the optical mode in the optical combiner where the propagation does become multi-modal.

In SSC 22 of TxPIC chip 10 of FIG. 6, in region 42B of the active region 42, the layers become increasingly narrower so that the optical mode in the case here can expand more into NID-InP layer 46B permitting the mode expansion to more approximate the numerical aperture of a coupling optical fiber. In this connection, other layers of the structure may be shortened, such as in a step-pad manner as is known in the art, to form an aperture in the waveguide 18 from the PIC that provides a beam from chip 10 to approximate the numerical aperture of a coupling optical fiber.

TxPIC chip 10 is fabricated through employment of MOCVD where, in forming active region 42 across all of the chips in an InP wafer, a patterned $SiO_2$ mask is positioned over the growth plane of the as-grown InP substrate. The patterned $SiO_2$ mask has a plurality of openings of different widths and masking spaces of different widths so that the growth rates in the mask openings will depend upon the area (width) of the opening as well the width of masks on the sides of the openings. The reason that the mask widths play a role in what is deposited in the openings is that the reactants, such as molecules of Ga and In, in particular In, breakup or crack from their carrier gas quickly at regions of the $SiO_2$ mask and will migrate off the mask into the mask openings. For example, quantum well layers grown in wider open areas tend to grow slower and have a different composition than quantum wells grown on narrower open areas. This effect may be employed to vary quantum well bandgap across the plane of the substrate for each of the DFB lasers 12, EAMs 14 and the field of the combiner 18. The corresponding differences in quantum well energy can exceed 60 meV, which is sufficient to create regions having a low absorption loss at the lasing wavelength. The $SiO_2$ masks are removed after the growth of active region 42. Additional growth and a subsequent etchback and regrowth are then performed, as previously discussed, to form a continuous buried waveguide integrated transmitter chip.

An optical transport module may be fabricated employing a separate RxPIC chip and a TxPIC chip. However, a TRxPIC chip is employed that includes both transmitter and receiver components. The transmitter and receiver components share a common AWG or may be two AWGs, a first AWG for the transmitter portion of the TRxPIC and a second AWG for the receiver portion of the TRxPIC. In this case, the AWGs may be mirrored imaged AWGs as known in the art. Embodiments of TRxPICs 10 are disclosed in FIGS. 7A through 8.

Reference is first made to FIG. 7A illustrating an embodiment of TRxPIC chip 10. Chip 10 comprises an array of DFB lasers 12 and array of EAMs 14 optically coupled via waveguides 24 to an optical combiner 18 comprising an arrayed waveguide grating (AWG) 50. As, an example, TRxPIC may have ten signal channels with wavelengths of $\lambda_1$ to $\lambda_{10}$ forming a first wavelength grid matching that of a standardized wavelength grid. However, as indicated before, the number of channel signal EMLs may be less than or greater than ten channels, the latter depending upon the ability to spatially integrate an array of EMLs with minimal cross-talk levels. AWG 50 is an optical combiner of choice because of its capability of providing narrow passbands for the respective channel signals thereby providing the least amount of noise through its filtering function. Also, AWG 50 provides for comparative low insertion loss. AWG 50, as known in the art, comprises an input slab or free space region 52, a plurality of grating arms 56 of predetermined increasing length, and an output slab or free space region 54. AWG 50 is capable of providing for transmission of multiplexed channel signals as well as to receive multiplexed channel signals. In this case, there are waveguides 26A and 26B coupled between the output slab 54 of AWG 50 and the output of chip 10. Output waveguide 26A is the output for multiplexed channel signals 27 generated on-chip by the EMLs and launched onto the optical link, and input waveguide 26B is the input for multiplexed channel signals 29 received from the optical link. To be noted is that TRxPIC chip 10 includes an array of integrated photodiodes (PDs) 15, two of which are shown at 15A and 15B, for receiving incoming demultiplexed channel signals on optically coupled waveguides 24 from AWG 50. Thus, AWG 50 is optically bidirectional and may be deployed simultaneously to multiplex outgoing optical channel signals to output waveguide 26A and to demultiplex (route) a multiplexed input optical signal, preferably comprising channel signals of different wavelengths from the outgoing channel signals, which are coupled from the optical link for distribution and detection to PDs 15A, 15B, etc. Thus, AWG 50 can function in one direction as a multiplexer and in the opposite direction as a demultiplexer as is known in the art. PDs 15 may be integrated PIN photodiodes or avalanche photodiodes (APDs). There may be, for example, an array of ten such PDs 15 integrated on TRxPIC 10. The electrical channel signals generated by PDs 15 are taken off-chip for further processing as known in the art. It is preferred that the EML inputs from waveguide 24 to slab 52 of AWG 50 as well as the outputs from slab 52 to PDs 15 are formed in the first order Brillouin zone output of slab 52.

Alternatively, it should be noted that the input signal to TRxPIC 10 may be one or more service channel signals, for example, from another optical receiver or TRxPIC transmitter. AWG 50 would route these signals to appropriate in-chip photodetectors 15 and taken off-chip as electrical service signals for further processing.

In the embodiments herein deploying an AWG as an optical combiner, the AWG may be designed to be polarization insensitive, although this is not critical to the design of the TxPIC 10. In general, an AWG does not need to be polarization insensitive because the propagating polarization modes from the respective DFB laser sources to the AWG are principally in the TE mode. However, due to multimode propagation in the AWG, the TM mode may develop in one or more arms of the AWG in a worst case situation. There are ways to combat this issue which are to (1) employ polarization selective elements, (2) place a TM mode filter at the output of the AWG and/or (3) make the SOAs 20, such as in the case of the embodiment of FIG. 6, have the same polarization bias as the DFB lasers 12 so that the amplification provided by the SOAs, following modulation, will amplify the TE mode rather than the TM mode so that any amount of presence of the TM mode will be substantially suppressed before the TE mode encounters the AWG 50.

The design of the passive output waveguide 26A of AWG 50 of TRxPIC chip 10, or any chip 10 embodiment output waveguide disclosed herein, involves several additional considerations. The total power coupled by the AWG output waveguide 26 into optical fiber link should be sufficient to allow low error rate transmission. It is, thus, desirable that the output waveguide have a low insertion loss to increase the coupled power. However, it is also desirable that the power density in the AWG output waveguide 26 be below the threshold limit for two photon absorption. For an AWG output waveguide, such as waveguide 26, this corresponds to approximately 20 mW total average power for all channels for a waveguide width in the range of approximately 1 µm to 3 µm. Additionally, it is also desirable that output waveguide 26 be oriented at an angle relative to an axis perpendicular to the plane of the output face or facet of chip 10, such as at an angle of about 7°, to reduce the capture of stray light emanating from the on-chip EMLs in order to maintain a high extinction ratio for signal channels. More will be said about this issue in connection with the embodiments of FIGS. 24A and 24B.

Reference is now made to FIG. 7B which discloses the same TRxPIC 10 of FIG. 7A except that the TRxPIC 10 of FIG. 7B includes, in addition, the array of SOAs 58A, 58B, etc. formed in the on-chip optical waveguides 24 to PDs 15A, 15B, etc. SOAs 58 respectively provide gain to demultiplexed channel signals that have experienced on-chip insertion loss through AWG 50 so that a stronger channel signal is detected by PDs 15. SOAs 58 are optional and can be eliminated depending upon the design of AWG 50 where it provides a low insertion loss, such as below 3 dB. TRxPIC 10 in both FIGS. 7A and 7B include, as an example, ten signal channels with wavelengths of $\lambda_1$ to $\lambda_{10}$ forming a first wavelength grid matching that of a standardized wavelength grid. The wavelength grid for received channel signals may be, for example, $\lambda_{11}$ to $\lambda_{20}$ forming a second wavelength grid matching that of a standardized wavelength grid. It is preferred that the incoming channel signals be of different grid wavelengths so as not to provide any interference, particularly in AWG 50. Compare this embodiment of FIG. 7B with the embodiment shown in FIG. 8 to be later discussed. In the case here of FIG. 7B, the wavelengths of the incoming signals are different from the outgoing signal, whereas in FIG. 8 the wavelengths of the incoming and outgoing channels are interleaved. In either case, the received channels, $\lambda_{11}$–$\lambda_{20}$, that are provided as an output from the AWG may be coupled into SOAs 58. Furthermore, an optional SOA 59 may be integrated in the input waveguide 26B before the input of AWG 50, a shown in FIG. 7B, to enhance the incoming multiplexed signal strength prior to demultiplexing at AWG 50.

Reference is now made to FIG. 7C which discloses a TRxPIC 10 that is identical to that shown in FIG. 7A except that chip includes integrated mode adaptors or spot size converters (SSCs) 62 and 64 respectively in waveguides 26A and 26B at the output of the chip for conforming the optical mode of the multiplexed signals from AWG 50 to better fit the numerical aperture of optical coupling fiber 60 and for conforming the optical mode of the multiplexed signals from fiber 60 to better fit the numerical aperture of chip 10 as well as waveguide 26B.

Another alternative approach for a TRxPIC 10 is illustrated in FIG. 8, which is basically the same as TRxPIC 10 of FIG. 7B except there are less transmitter and receiver channels, for example, only six transmitter channels and six receiver channels are disclosed, and the integrated receiver channels are interleaved with the integrated transmitter channels. Also, a single output waveguide 26 is for both received and transmitted channel signals for chip 10. Chip 10 also has a gain-clamped semiconductor optical amplifier (GC-SOA) 70 instead of a SOA. GC-SOA 70 is preferred, particularly for received channel signal 29, not only for providing on-chip gain to these signals but also the gain clamped signal or laser signal eliminates the loss of gain to higher wavelength channels. Further, the TE/TM gain ratio of the multiplexed signal traversing the GC-SOA 70 is fixed due to the presence of the gain clamped signal. Also, GC-SOA 70 provides gain to the outgoing multiplexed channel signals, 11–110. More about the utility of GC-SOAs is found in U.S. patent application, Ser. No. 10/267,304, incorporated herein by its reference. A single AWG 50 is employed for both the transmitter and receiver channels, which signal channels have interleaved wavelength bands. The channel wavelength band for the transmitter channels are $\lambda_1$–$\lambda_6$, whereas the channel wavelength band for the receiver bands are $\lambda_1+\Delta$–$\lambda_6+\Delta$ where $\Delta$ is a value sufficient to not cause significant cross-talk with the transmitter channels. A GC-SOA is required in this embodiment as a non-clamped SOA will result in significant cross-talk and pattern dependent effects. Furthermore, it is likely that the power levels of the incoming 29 and outgoing 27 channels will be significantly different resulting in gain compression of the higher power signals. Thus, a GC-SOA is required for the practical implementation of an on-chip amplifier in the location shown in FIG. 8.

Manufacturing variances in waveguide layer thicknesses and grating periodicity can cause significant variance in emission wavelength of DFB lasers fabricated on the same wafer and substantial lot-to-lot variance. Depending upon the fabrication process employed, the absolute accuracy of the DFB/DBR wavelength may be greater than about 1 nm due to the empirical process variances. For a single discrete DFB laser, control of heat-sink temperature permits tuning to within less than 0.1 nm. Consequently, it is desirable to monitor and lock the emission wavelength of each DFB laser in the array of the TxPIC to its assigned channel wavelength while also maintaining the desired output power of each channel. The light output of at least one laser may be provided as input to a filter element having a wavelength-dependent response, such as an optical transmission filter. The optical output of the filter is received by an optical detector. Changes in lasing wavelength will result in a change in detected optical power. The lasers are then adjusted (e.g., by changing the drive current and/or local temperature) to tune the wavelength. If there are SOAs or PIN photodiodes on TxPIC 10 integrated between the DFB lasers and the AWG in each signal channel, the SOA or PIN photodiode for each signal channel may be adjusted to adjust the relative output power levels to desired levels across the channels.

Reference is made to FIG. 9 illustrating another embodiment, this time of a TxPIC 10 which comprises only the transmitter channels of EMLs. Each EML optical channel comprises a DFB laser 12 and modulator 14 and AWG 50 of FIG. 7A, but having a single output waveguide 26 and one single photodiode PD 15T optically coupled by a waveguide 24 to the input slab 52 of AWG 50. PD 15T may be coupled at the second order Brillouin zone of slab 52 rather than the first order Brillouin zone where all the signal channels are coupled into slab 52. The application here of PD 15T is different from the previous embodiments in that it deployed to check parameters on the chip after manufacture such as the amount of reflected light occurring within chip 10. In fabricating a TxPIC chip, it is often necessary to AR coat one or more facets of the chip, such as facet 10F of chip 10 where an AR coating 51 is place on this output facet to prevent facet reflections of light back into chip 10 from interfering with the multiplexed output signal. When an AWG 50 is involved, the second order Brillouin zone, PD 15T on the input side of AWG 50 may be utilized to monitor this reflected light from facet 10F. PD 15T is operated as facet 15T is being AR coated, i.e., in situ, or employed as a check of facet coating reflectivity after the AR coating has been completed. During in situ use, when a desired, after minimum, reflection is detected by PD 15, the AR coating process is terminated, the desired thickness of the AR coating having been achieved. Also, PD 15T may be deployed later in field use as a trouble shooting means to determine if there are any later occurring internal reflections or undesired light entering the chip from the optical link interfering with its operation.

As shown in Fig.10, a TxPIC and a RxPIC are fabricated on a single substrate with each having their separate AWGs. In this embodiment, the integrated PIGs can be utilized in a digital OFO REGEN as also explained and described in U.S. patent application, Ser. No. 10/267,212, filed May 10, 2002 and published on May 29, 2003 as Pub. No. US2003/0099018A1, incorporated herein by its reference. In FIG. 10 an OEO REGEN 79 comprises RxPIC 80 and TxPIC 10 integrated as single chip. As in past embodiments, TxPIC 10 comprises an array of DFB lasers 12 and EA modulators 14, pairs of which are referred to as EMLs. The outputs of the EMLs are provided as input optical combiner 18, such as, for example an AWG or power (star) coupler. Optical combiner 18 has an output at 27 for optical coupling to fiber link. RxPIC 80 comprises an optical wavelength-selective combiner 82, such as, for example an AWG or Echelle grating, which receives an optical multiplexed signal 29 for demultiplexing into separate wavelength grid channel signals which, in turn, are respectively detected at an array of photodetectors 84, such PIN photodiodes, providing an array of electrical channel signals.

As noted in FIG. 10, the OEO REGEN 79 is flip-chip solder bonded to a submount, including solder bonding at 86 for connecting the converted electrical signals to IC control chip or chips 94, via electrical conductors and conductive vias in and on submount 83. IC control chip or chips 94 comprise a TIA circuit, an AGC circuit, as known in the art, and a 3R functioning circuit for re-amplifying, reshaping and retiming the electrical channel signals. The rejuvenated electrical channel signals are then passed through submount, via electrical conductors and conductive vias in and on submount, to IC modulator driver 98 where they are provided to drive EA modulators 14 via solder bonding at 90 via their coupling through conductive leads in or on submount 83. Further, IC bias circuit chip 96 provides the bias points for each of the respective lasers 12 to maintain their desired peak wavelength as well as proper bias point for EA modulators 14 midway or along the absorption edge of the modulators at a point for proper application the peak-to-peak voltage swing required for modulation. As can be seen, the embodiment of FIG. 10 provides for a low cost digital regenerator for regeneration of optical channel signals that is compact and resides almost entirely in the exclusive form of circuit chips, some electronic and some photonic. Such an OEO REGEN 79 is therefore cost competitive as a replacement for inline optical fiber amplifiers, such as EDFAs.

To facilitate microwave packaging, the OEO REGEN 79 is preferably flip-chip mounted to a submount to form electrical connections to the several IC control chips. Also, note that IC control chips can be flip-chip bonded to OEO REGEN 79. Also, further note that the OEO REGEN 79 may comprise two chips, one the TxPIC chip 10 and the other the RxPIC chip 80.

Referring now to FIG. 11, there is shown another embodiment of a TxPIC chip 100A wherein an array of PDs 101(1) . . . 101 (N) is provided, separate and outside of chip 100A, where each PD 101 is optically coupled to a rear facet of a respective DFB laser 102(1). 102(N). It can be seen that there are an integral number of optical channels, $\lambda_1, \lambda_2, \ldots \lambda_n$, on chip 100A, each of which has a different center wavelength conforming to a predetermined wavelength grid. PDs 101 are included to characterize or monitor the response of any or all of respective on-chip DFB lasers 102(1) . . . 102(N). DFB lasers 102(1) . . . 102(N) have corresponding optical outputs transmitted on corresponding passive waveguides forming optical paths that eventually lead to a coupling input of optical combiner 110. For example shown here, the optical waveguides couple the output of DFB lasers 102(1) . . . 102(N, respectively, to an SOA 104(1) . . . 104(N), which are optional on the chip, an EA modulator 106(1) . . . 106(N) with associate driver $106A_1 \ldots 106A_N$, an optional SOA 108(1) . . . 108(N) and thence optically coupled to optical combiner 110, which may be, for example, an AWG 50. Each of these active components 102, 104, 106 and 108 has an appropriate bias circuit for their operation. The output waveguide 112 is coupled to an output of optical combiner 110.

Optical combiner 110 multiplexes the optically modulated signals of different wavelengths, and provides a combined output signal on waveguide 112 to output facet 113 of TxPIC chip 100A for optical coupling to an optical fiber (not shown). SOAs 108(1) . . . 108(N) may be positioned along optical path after the modulators 106(1) . . . 106(N) in order to amplify the modulated signals prior to being multiplexed and transmitted over the fiber coupled to TxPIC chip 100A. The addition of off-chip PDs 101(1) . . . 101(N) may absorb some of the power emitted from the back facet of DFB lasers 102(1) . . . 102(N), but, of course does not directly contribute to insertion losses of light coupled from the front facet of DFB lasers 102(1) . . . 102(N) to other active on-chip components. The utility of off-chip PDs 101(1) . . . 101(N) is also beneficial for measuring the power of DFB lasers 102(1) . . . . 102(N) during a calibration run, and also during its operation, in addition to being helpful with the initial testing of TxPIC 100A.

In FIG. 11, cleaved front facet 113 of chip 100A may be AR coated to suppress deleterious internal reflections. Where the off-chip PDs 101(1) . . . 101(N) are designed to be integral with chip 100A, the employment of an AR coating on front facet 113 may be unnecessary because much of the interfering stray light internal of the chip comes from the rear facet of the lasers reflecting internally to the front facet 113. As will be appreciated by those skilled in the art, each DFB laser 102 has an optical cavity providing light in the forward and rearward directions.

Conventional semiconductor laser fabrication processes for DFB and DBR lasers permits substantial control over laser wavelength by selecting a grating periodicity. However, variations in the thickness of semiconductor layers or grating periodicity may cause some individual lasers to lase at a wavelength that is significantly off from their target channel wavelength. In one approach, each laser and its corresponding SOAs are selected to permit substantial control of lasing wavelength (e.g., several nanometers) while achieving a pre-selected channel power.

The DFB laser may be a single section laser. Additionally, the DFB laser may be a multi-section DFB or DBR laser where some sections are optimized for power and others to facilitate wavelength tuning. Multi-section DFB lasers with good tuning characteristics are known in the art. For example, multi-section DFB lasers are described in the paper by Thomas Koch et al., "Semiconductor Lasers For Coherent Optical Fiber Communications," pp. 274–293, *IEEE Journal of Lightwave Technology*, Vol. 8(3), March 1990, which is incorporated herein by its reference. In a single or multi-section DFB laser, the lasing wavelength of the DFB laser is tuned by varying the current or currents to the DFB laser, among other techniques.

Alternatively, the DFB laser may have a microstrip heater or other localized heater to selectively control the temperature of the laser. In one approach, the entire TxPIC may be cooled with a single TEC thermally coupled to the substrate of the TxPIC such as illustrated in FIG. 12. FIG. 12 illustrates TxPIC chip 100B which is substantially identical to the embodiment of FIG. 11 except includes, in addition, integrated PDs 107(1) . . . (N) between modulators 106(n) . . . (N) and SOAs 108(1) . . . (N), device heaters 102A, 108A and 112 as well as PDs 101(1) . . . 101(N) which, in this case are integrated on chip 100B. PDs 101 may be deployed for initial characterization of DFB lasers 102 and then subsequently cleaved away as indicated by cleave line 116. PDs 107 are deployed to monitor the output intensity and modulator parameters such as chirp and extinction ratio (ER).

The array of DFB lasers 102 may have an array bias temperature, $T_0$, and each laser can have an individual bias temperature, $T_0+T_i$ through the employment of individual laser heaters $102A_1 \ldots 102A_N$. In FIG. 12, there is shown a heater $102A_1 \ldots 102A_N$ for each DFB 102 on TxPIC chip 100B, and also a separate heater 111 for optical combiner 110 and a TEC heater/cooler 114 for the entire the chip. The best combination may be a heater 102A for each respective DFB laser 102 and a chip TEC heater/cooler 114, with no heater 111 provided for combiner 110. In this just mentioned approach, the TEC 114 may be employed to spectrally adjust the combiner wavelength grid or envelope, and individual heaters 102A of DFB lasers 102 are then each spectrally adjusted to line their respective wavelengths to the proper wavelength channels as well as to match the combiner wavelength grid. Heaters 102A for respective DFB lasers 102 may be comprised of a buried heater layer in proximity to the periodic grating of each DFB laser, embodiments of which are disclosed and described in U.S. application, Ser. No. 10/267,330, filed Oct. 8, 2002, published on May 22, 2003 as Pub. No. US2003/0095736A1 and incorporated herein by its reference. It should be noted that in employing a chip TEC 114 in combination with individual heaters 102A for DFB laser 102, it is preferred that TEC 114 function as a primary cooler for chip 100B be a cooler, rather than heater, so that the overall heat dissipation from chip 100B may be ultimately lower than compared to the case where TEC 114 is utilized as a heater to functionally tune the combiner wavelength grid. Where TEC 114 functions primarily as a cooler, a spatial heater 11 may be suitable for tuning the wavelength grid of combiner while TEC 114 function as a primary cooler for chip 100B to maintain a high level of heat dissipation. Then, individual DFB lasers 102 may be tuned to their peak operating wavelengths and tuned to the combiner grid.

Reference is now made to the embodiment of FIG. 13 illustrating TxPIC chip 100C that is identical to chip 100A in FIG. 11 except for heaters 102, the addition of integrated PDs 105(1) . . . 105(N) positioned in EML optical paths between SOAs 104(1) . . . 104(N) and modulators 106(1) . . . 106(N). SOAs 104 are disposed between DFB lasers 102 and modulators 106 and PDs 105 are disposed between SOAs 104 and modulators 106. In order to obtain the desired total output power from DFB lasers 102, two alternatives are now described. First, initialization of lasers 102, a bias voltage is applied to PDs 105 for purposes of monitoring the output of the DFB lasers 102, attenuation, $\alpha_{bias}$, of the photodiodes may, themselves, result in an insertion loss. However, by adjusting the bias of SOAs 104, the total desired output power for a given EML stage of TxPIC chip 100C may be maintained. One benefit of PDs 105 is the provision of dynamic on-chip feedback without necessarily requiring pre-existing calibration data. Another benefit of PDs 105 is the enablement of the gain characteristics of SOAs 104 to be discerned. Second, during normal operation of TxPIC chip 100C, PDs 105 can function as passive components through the lack of any biasing, which, if bias existed, would provide some attenuation, $\alpha_{bias}$. When PDs 105 function more like a passive device, e.g., with no applied reverse bias, insertion losses associated with such in-line PDs 105 may be substantially eliminated. For many power monitoring application, PDs 105 need not to be operated as a reverse biased device and can even be slightly or partially positive bias to minimize any residual insertion loss and render them more transparent to the light from DFB lasers 102. Alternatively, a small portion, such as 1% or 2%, of the light in the EML optical path may be tapped off by deploying PDs 105 that include a blazed grating in the active/waveguide core, where the light is taken off-chip for other functions such as wavelength locking of lasers 102 or adjustment of the laser intensity. As in the previous embodiment of FIGS. 11 and 12, PDs 105 may be a PIN photodiode or an avalanche photodiode, where the former is preferred.

Thus, from the foregoing, it can be seen that during a test mode, prior to cleaving chip 100C from its wafer, PDs in FIG. 13 may operate as an in-line power taps of optical power from DFB lasers 102 to calibrate their operating characteristics. As previously indicated, after TxPIC chip 100C has been cleaved from its wafer, during its a normal operational mode, PDs 105 may be operated to be optically transparent in order to minimize their inline insertion losses, or may be slightly forward biased to further minimize any residual insertion losses or may be operated with selected reverse bias to adjust attenuation to a desired level.

Reference is now made to the embodiment of FIG. 14 illustrating TxPIC chip 100D, which is identical to FIG. 12, except there are PDs 109 following SOAs 108 in the optical paths, whereas in FIG. 12 PDs 107 precede SOAs 108. PDs 109 are beneficial for characterizing the total performance of all optical components upstream of these PDs, and hence, can be deployed as monitors of the total channel power before combiner 110. Furthermore, the insertion loss of optical combiner can be characterized by utilizing PDs 105 in combination with an additional photodiode integrated on chip 100D in a higher order Brillouin zone output of combiner 110 or positioned in the off-chip output 120 of optical combiner 120, as shown in FIG. 15.

Reference now is made to FIG. 15 illustrating TxPIC 100E, which is identical to TxPIC 100B in FIG. 12 except that there is shown a fiber output 120 optically coupled to receive the multiplexed channel signals from output waveguide 26 where a portion of the signals are tapped off fiber 120 via tap 122 and received by PD 124. PD 124 may be a PIN photodiode or an avalanche photodiode. As previously indicated, PD 124 may be integrated in wafer. PD 124, as employed on-chip, may be employed for testing the chip output prior to cleaving TxPIC chip 100E from its wafer, in which case the photodiode is relatively inexpensive to fabricate and would be non-operational or cleaved from the chip after use. PD 124 is coupled to receive a percentage, such as 1% or 2%, of the entire optical combiner output, permitting the optical power characteristics of TxPIC chip 100E to be determined during wafer level testing, such as for the purposes of stabilization of laser wavelengths and/or tuning of the wavelength grid response of optical combiner 110 to reduce insertion losses.

It should be noted that both SOAs, such as SOAs 108, or photodetectors, such as photodiodes 109, can further serve as optical modulators or as variable optical attenuators, in addition to their roles as monitors. Multiple of these functions can be performed simultaneously by a single photo-detector, such as photodiode 124, or an integrated, on-chip photodiode at a first or higher order output of the multiplexer, or the functions can be distributed among multiple photodetectors. On-chip photodetectors can vary power by changing insertion loss and, therefore, act as in-line optical circuit attenuators. They also can be modulated at frequencies substantially transparent to the signal channel wavelength grid with little effect to modulate data that is not necessarily the customer's or service provider's data.

Additionally, optical combiner 110 may include integrated photodiodes at the output of optical combiner 110 to facilitate in locking the laser wavelengths and/or tuning of the grid of optical combiner 110 to reduce insertion losses. Additionally, PD 124 may be utilized to determine the high-frequency characteristics of modulators 106. In particular, PD 124 and associated electronic circuitry may be employed to determine a bias voltage and modulation voltage swing, i.e., the peak-to-peak voltage, required to achieve a desired modulator extinction ratio (ER) and chirp as well as to characterize the eye response of each modulator through application of test signals to each of the EA modulators 106. The bias voltage and voltage swing of the modulator may be varied. An advantage of having PD 124 integrated on chip 100E is that, after initial optical component characterization, the photodetector may be discarded by being cleaved off TxPIC chip 100E. An arrangement where photodiodes are in integrated at the output of combiner 110 on TxPIC chip is disclosed in FIG. 7 of U.S. patent application, Ser. No. 10/267,330, incorporated herein by its reference. The ability to discard the photodetector has the benefit in that the final, packaged device does not include the insertion loss of the photodetector formerly employed to characterize the performance of the modulator during an initial characterization step.

Although particular configurations of SOAs and PDs are shown in FIGS. 11–15, it will be understood by those skilled in the art that more than one SOA may also be employed along any channel.

Referring now to FIG. 16, there is shown in-wafer, the chip die of TxPIC 100B, although other embodiments of FIG. 12 or 13–15 may be shown. A combination of photodiodes, both those inline with EML channels, such as PDs 101 and 109, as well as those off-line, not shown, which may be used to tap off optical power from an inline blazed grating PD or from tap off from output 112. Photodiodes may be located in several locations in TxPICs 100E in order to perform either on-substrate testing or inline testing when TxPICs 100E is operating "on-the-fly". Also, a probe tester can be utilized for testing the TxPICs. It should be noted that PDs 101 at the rear facet of DFB lasers 102 may be left on the final cleaved TxPIC chip and utilized during its operational phase to set, monitor and maintain the DFB and SOA bias requirements.

FIG. 17 discloses, in flowchart form, a procedure for adjustment of the wavelength of the channel lasers, set to a predetermined grid wavelength, after which the on-chip SOAs may be adjusted to provide final appropriate output power. As seen in FIG. 17, first, a channel is selected at 130 in the TxPIC for testing. Next, the selected DFB laser is turned on and the output is checked via a photodiode, such as PDs 105 in FIG. 13, to generate data and provide calibrated data (134) as to whether the laser wavelength is off from its desired grid wavelength and by how much. This calibrated data is used to adjust the laser wavelength (136) by current or heater tuning. If the desired wavelength is not achieved (138), the calibration process is repeated. The change in wavelength may also change the optical power available since the power via applied current to the laser affects the amount of power. If optimized wavelength and optical power adjustment is achieved (138), then SOA, such as SOAs 104, is adjusted (140) to provide to desired output power for the laser. If all of the laser channels on the TxPIC chip have not been tested (142), the next laser channel is selected (146) and the process is repeated at 132. When the laser channel has been tested, the calibration data for all laser channels for the test TxPIC chip is stored at 144 for future use, such as for recalibration when the transmitter module in which the TxPIC chip is deployed is installed in the field. The stored data functions as benchmark from which further laser wavelength tuning and stabilization is achieved.

Reference is now made to FIG. 18 illustrating another configuration for TxPIC 10 deploying dummy optical components to the edges of a wafer and/or edges of the PIC chips in order to maximize chip yield. These dummy components would be fabricated in the same way as the other optical components on the wafer using MOCVD. TxPIC 10 of FIG. 18 comprises a plurality of DFB lasers 12 and EA modulators 14 formed as integrated EML channels which are coupled to AWG 50 via integrated waveguides 24. On adjacent sides of these optical components are additional DFB lasers 12A and EA modulators 12A on one side and additional DFB lasers 12B and EA modulators 12B on the other side. These additional optical components are all shown as optically coupled to AWG 50. However, they need not be so connected to AWG 50. Furthermore, it is not necessary that bonding pads be connected to them. This will save chip space or chip real estate. The function of the dummy optical components is to take on the faulty attributes that occur to fabricate optical components at edges of wafers or chips. It is problematic that the areas of component defects due to wafer fabrication, such as growth and regrowth steps, lithography, and other processing steps will likely be at the edges of the wafer or boarder components on TxPIC chip edges where these extra dummy optical components reside. By employing these dummy components, the yield of useable wafers and good TxPIC chips will significantly increased.

Generally speaking from MOCVD fabrication experience as well as from backend chip processing experience, the component yield on any PIC chip with multiple optical components tends to decrease relative to either optical PIC chips formed at the edges of the wafer or optical components formed along the edges of the PIC chip. There are several reasons for this attribute. First, at the InP wafer level, an outer perimeter region of the wafer tends to have the greatest material non-uniformity and fabrication variances. An edge region of a PIC may correspond to one of the perimeter regions of the wafer and, hence, also have such significant variances. Second, the cleaving of the wafer produces the PIC dies. The cleaving process may adversely affect the edge optical components of the PIC die or these edge components may experience the greatest amount of handling.

Statistical methods are employed to form a map of edge regions having a reduced yield compared with a central region of a chip or die, or at the wafer level. The redundancy number of dummy optical components required in an edge region is selected to achieve a high yield of wafers where at least one of the dummy optical components is operable for testing or replacement of another failed component. As an illustrative example, if the yield in a central PIC region was 90% but dropped to 60% in an edge region, each dummy optical component in the edge region could include one or more redundant optical components to increase the effective dummy optical component yield to be at least comparable to the central region. It will also be understood that placing dummy optical components in edge regions may be practiced in connection with previously described embodiments.

To be noted is that the output waveguides 26 of AWG 50 in FIG. 18 is a vernier output in the first order Brillouin zone output of AWG 50. The optimum waveguide among the several waveguides shown is chosen based upon the waveguide exhibiting the best overall wavelength grid response.

It should be noted that with respect to the foregoing TxPIC chip and TRxPIC chip embodiments as well as, provision should be made for circumvention of free carrier absorption due to two photon absorption in passive waveguides 26 from AWG 50. The output waveguide length from the optical combiner or AWG must allow sufficient output power to permit low error rate transmission but also must be below the limit for 2 photon absorption. The 2 photon absorption limit is about 20 mW total average power for all signal channels for an approximately 1 µm to 3 µm wide output waveguide.

Two photon absorption can occur in passive waveguide structures, particularly if sufficiently long to induce photon absorption in their waveguide core. There are several ways to circumvent this problem. First, reduce the peak intensity in the waveguide, either transversely or laterally or both. By rendering the mode to be less confined, i.e., making the mode larger, the chance for the onset for two photon absorption will be significantly reduced if not eliminated. Second, the peak intensity of the optical mode may be shifted so as not to be symmetric within the center of the waveguide, i.e., the peak intensity of the mode is asymmetric with respect to the cladding or confining layers of the guide as well as the center position of the waveguide core. This asymmetry can be built into the chip during its growth process. Third, increase the $E_g$ of core waveguides/cladding layers. In all these cases, the point is to reduce the peak intensity in some manner so that the threshold for two photon absorption is not readily achieved.

Another approach to reduce or otherwise eliminate the free carrier absorption due to two photon absorption is by hydrogenation of the waveguides in situ in an MOCVD reactor or in a separate oven. The process includes employing $AsH_3$, $PH_3$ and/or $H_2$ which creates $H^+$ atom sites in the waveguide layer material during component fabrication which dissipate or rid the waveguide of these absorption carriers.

Reference is now made to FIG. 19A illustrating another embodiment of TxPIC, which in the case here includes an extra or dummy EML signal channel beside each of the EML signal channels to be deployed for on-chip operation. As shown, extra DFB lasers 12EX and EA modulators 14EX are formed on chip 10 adjacent to a corresponding laser 12 and modulator 14 These sets of such lasers and modulators have the same bandgap wavelengths and lasing wavelengths. Thus, if a laser 12 or modulator 14 in an operating set would fail, the adjacent laser 12EX and modulator 14EX would be substituted in place of the failed EML channel set. Alternatively, it should be realized that, instead of functioning as replacement EML channel sets on chip 10, these extra EML channel sets can be deployed later, at an additional cost to the carrier provider, to further increase the signal channel capacity of the transmitter module. It should be realized that chip 10 can be made to include additional capacity not initially required by the service provider at a minimal cost of providing addition integrated EML channel sets on the chip which can be placed into operation at a later time. This is an important feature, i.e., the utilization of micro-PICs having multiple arrays of EMLs fabricated on the same chip.

Reference is now made to FIG. 19B illustrating TxPIC chip 10 with pairs of DFB lasers 12A and 12B for each EML channel to provide redundancy on TxPIC chip 10. Each of the lasers 12A and 12B are coupled to an integrated optical 2×1 combiner 13. Thus, the second DFB laser of each pair 12A and 12B, can be placed into operation when the other DFB laser fails to meet required specifications or is inoperative. This redundancy can be applied to modulators 14 as well. This feature can be combined with the dummy optical component feature set forth in FIG. 19A.

Reference is now directed to the TxPIC chip 10 in FIG. 20 which illustrates an embodiment of the contact layout strategy for EMLs on the chip. A multichannel TxPIC chip 10 has a substantial area compared to a conventional single semiconductor laser. Each optical signal source of a TxPIC requires driving at least one modulator section. Each modulator section requires a significant contact pad area for making contact to a microwave feed. This creates potential fabrication and packaging problems in routing microwave feeds across the substrate onto the modulator contact pads. As illustrated in the embodiment of TxPIC chip 10 in FIG. 20, as an example, the location of contact pads 171 for the modulators may be staggered to facilitate microwave packaging. Microwave contact pads 171 are coupled to modulators 14 for coupling RF signals to the modulator electrodes. Chip 10 is shown with eight EML channels optically coupled to optical combiner 16 for multiplexing the channel signals and placement on output waveguide 18 for coupling to an optical link. The important feature is that the EA modulators 14 are staggered relative to one another along the optical path between respective DFB lasers 12 and optical combiner 16. The purpose for this arrangement is to provide for easier electrical contact directly to the modulators 14 for signal modulation and bias. As shown in FIG. 20, co-planar microwave striplines 170, 172 and 174 are fabricated on top of the chip to each modulator 14 from contacts 171, where lead 170 is connected to a prepared opening to p-contact 173 and coplanar leads 172 and 174 are connected to a prepared opening to common n-contact 175. Contacts 175 are connected to the n-side of the modulator through a contact via provided in the chip, such as down to n-InP layer 38 in the embodiment of FIG. 6. The p-contact pad is connected to the contact layer, such as to contact layer 48 in the embodiment of FIG. 6. The modulators 14 are electrically separated from one another through etched channels prepared between the modulators which may extend down as far as the InP substrate 32 as shown in the embodiment of FIG. 6. Also, a bias lead (not shown) is connected to the n and p contacts to provide a bias midpoint for the voltage swing from peak-to-peak in modulation of the modulator. Also, bias leads 176 are also provided to each of DFB lasers 12 from edge contact pads 170 provided along the rear edge of chip 10. Thus, contact pads 171 for modulators 14 are provided along two side edges of chip 10 whereas contact pads 1070 are provided along one rear edge of chip 10 for bias connection to DFB lasers 12 except that the centrally located modulators 14 have their RF and bias contacts extend from the rear edge contacts 170.

Pad staggering can also be accomplished in several different ways. First, additional passive waveguide sections are included to stagger the locations of the optical modulators relative to a die or chip edge. For example, a curved passive waveguide section can be included in every other DFB laser to offset the location of the optical modulator and its contact pads. Second, the contact pads of modulator 14 are geometrically positioned relative to the chip edges to be staggered so that straight leads can be easily designed to extend from edge contact pads to the staggered modulator pads.

Reference is made to FIG. 20A which illustrates in graphic form the general waveforms for modulation of modulators 14. In FIG. 20, there is line 180 which is zero bias. Modulators 14 are modulated with a negative bias to provide low chirp with high extinction ratio. Thus, the voltage bias, $V_B$, is set at a negative bias at 182 and the voltage swing has a peak-to-peak voltage, $V_{PP}$, 184 within the negative bias range. The modulation of modulator 14 according to a data signal illustrates the corresponding modulator output at 186. One specific example of voltages $V_B$ and $V_{PP}$ is a bias voltage of $V_B$=−2.5V and a swing voltage of 2.5V or $V_{PP}$=−1.25V to −3.75V.

Reference is now made to the embodiment shown in FIG. 21 which is a perspective view of a TxPIC chip 10. The assembly in FIG. 21 comprises a multi-layer ceramic, or similar submount is utilized. As will be seen in the description of this embodiment, a submount is mounted above TxPIC chip 10 and in close proximity to the high-speed modulation pads on TxPIC chip 10. Transmission lines are formed on the submount. Microwave shielding may be included above the submount. In order to ensure that sufficient isolation is achieved between TxPIC 10 and the submount, an airgap, d, is formed between these two components, preferably where d is in a range of values around 5 mils or 127 μm.

Each of the optical modulators 14 of TxPIC chip 10 require at least one microwave drive signal stripline 200 and at least one common stripline 198. However, in the embodiment here, two common striplines 198 are utilized to reduce crosstalk between the striplines of adjacent striplines to be connected to adjacent modulators 14 on chip 10. RF striplines, comprising striplines 198 and 200, are formed on an array connector substrate 195, which may be made of a ceramic material, which is spaced, such as by 50 μm, from TxPIC chip 10 as seen at 193. The forward ends of striplines 198 and 200 are respectively contacted to p-contact pads 173 and common n-contact pads 175 by means of bonding wires 196B as shown in FIG. 21. Alternatively, these connections can be made by wire ribbon bonding or with a flexible circuit cable.

Chip 10 is supported on CoC submount 190 which includes patterned conductive leads 191 formed on a portion of the submount 190. These leads may, for example, be comprised of TIW/Au. Submount 190 may, for example, be comprised of AlN. These patterned leads 191 end at contact pads 191A along the rear edge of chip 10. The bias signals provided on these leads 191 are tranferred to on-chip contact pads 191B, (which may have a 100 μm pitch on TxPIC 10) by means of a wire bonded ribbon 196A, or alternatively, a flexible circuit cable, where the respective ribbon leads are connected at one end to contact pads 191A and at the other end to contact pads 191B for DFB lasers 12. The additional patterned leads are utilized for connecting to on-chip laser source heaters and on-chip monitoring photodiodes.

An important feature of the embodiment of FIG. 21 is the deployment of an L-shaped substrate 192 that has a thickness greater than that of chip 10 so that the mounting of array connector substrate 195 on the top of L-shaped substrate 192 will provide for the micro-spacing of around 5 mils or 127 μm between chip 10 and substrate 195 so that no damage will occur to chip 10, particularly during the backend processing of connecting conductor leads to chip 10. Thus, substrate 192 may be cantilevered over chip 10 or a support post may be provided between substrate 192 and substrate 195 at corner 199.

The assembly in the embodiment of FIG. 21 is concluded with top cover 194 over substrate 195 which is micro-spaced from the top of substrate 195 with spacer substrates 195A and 195B to provide spacing over RF striplines 197. Cover 194 may be made of AlN or alumina and is provided for a microwave protection shield for the micro-striplines 198 and 200 as well as to provide structural support, particularly the suspended portion of the assembly platform (comprising parts 195, 19× and 194) overhanging TxPIC chip 10 at 199. Cover 194 also includes cutout regions 194A and 194B where cutout region 194B provides for tool access to make the appropriate contacts 196B of the forward end striplines 198 and 200 respectively to contact pads 175 and 173 of chip modulators 14. The rearward ends of striplines 198 and 200 are exposed by cutout region 194A for off-chip assembly connection to a signal driver circuit as known in the art.

A conventional alternative to the deployment microwave striplines 197 is to use wire bonding. However, it is not practical to use conventional wirebonds to route a large number of microwave signals in a PIC. This is due, in part, to the comparatively large area of the PIC that would be required to accommodate all the wirebond pads and the wirebonds would have to traverse a distance as long as several millimeters to reach all of the modulators. Also, the length of such wirebonds would create an excessively large wire inductance and, therefore, would not be feasible. Additionally, the microwave cross-talk between the bonding wires would be excessive. The high speed application required by TxPIC 10 for higher speed data rates requires a transmission line with impedance matching to the drive circuit which is difficult if not impossible to achieve with wire bonding. Thus, it is more suitable to deploy a flexible circuit microwave interconnect, such as at 196A, to couple RF or microwave striplines 197 formed on substrate 195 to contact pads 173 and 175 of each modulator 14. A flexible microwave interconnect is an alternative to wirebonds 196A for two reasons. First, they provide a reduction in assembly complexity. Second, they provide reduced inductance for wirebonds of equivalent length. A flexible circuit microwave interconnect is a microwave transmission line fabricated on a flexible membrane, e.g., two traces spaced apart to form a co-planar microwave waveguide on a flexible membrane, that is at least one ground stripline for each signal stripline. However, in the embodiment of FIG. 21, two ground striplines are shown which provides for less signal interference due to crosstalk with other tri-coplanar striplines. Each flexible microwave interconnect at 196B would preferably have a contact portion at its end for bonding to contact pads 173 and 175 of a modulator 14 using conventional bonding techniques, such as solder bonding, thermo-compression bonding, thermal-sonic bonding, ultra-sonic bonding or TAB consistent with wire ribbon bonding and/or flexible cable interconnects.

It should be realized that TxPIC 10 may be flip chip mounted to a submount, such as an alumina, aluminum nitride (AlN), or a beryllium oxide (BeO) submount. The submount is provided with patterned contact pads. In one approach, the submount includes vias and microwave waveguides for providing the signals to the modulators. Conventional flip chip soldering techniques are employed to mount the PIC electrical pads to the submount. The solder is preferably a solder commonly used for lasers, such as gold-tin, or lead-tin. A gold-gold thermo-compression bonding process may also be employed. General background information on flip-chip packaging technology is described in the book by Lau, et al., *Electronic Packaging: Design, Materials, Process, and Reliability*, McGraw Hill, NY (1998), which is incorporated herein by its reference. Some background information on microwave circuit interconnect technology is described in the book by Pozar, *Microwave Engineering*, John Wiley & Sons, Inc. NY (1998).

There is a significant packaging cost associated with providing separate DC contact pads for driving each semiconductor laser, such as DFB lasers or DBR lasers. Driving the contact pads of groups of semiconductor lasers simultaneously reduces the number of DC pin outs and DC interconnect paths required, which permits a substantial reduction in PIC area and packaging complexity, reducing PIC costs. As an example of one approach, all of the DFB lasers 12 on a TxPIC 10 are driven in parallel. Alternatively, groups of lasers, e.g., three lasers, are coupled in parallel. For multi-section lasers having a primary drive section and a tuning section, the drive sections of groups of lasers may be driven in parallel. Driving lasers in parallel reduces the packaging cost and the number of DC pin outs required. However, it also requires that the lasers have a low incidence of electrical short defects. Moreover, in embodiments in which groups of lasers are driven in parallel, it is desirable that the lasers have similar threshold currents, quantum efficiencies, threshold voltages, and series resistances. Alternatively, the lasers may be driven in parallel, as described above with the current to each laser being tuned by trimming a resistive element couple in the electrical drive line to the laser. Such trimming may be accomplished by laser ablation or standard wafer fabrication technology etching. The former may occur in chip or wafer form whereas the later is in wafer form. The trimming is done after the L-I characteristics are measured and determined for each laser.

Reference is now made to FIG. 22 which illustrates, in schematic form, the use of a probe card 200 containing a plurality of contact probes 206A and 206B, such as, for example, one for each inline optical active component, e.g., inline laser sources and their respective modulators, for each PIC chip to provide wafer level reliability screening before or after wafer burn-in or die cleaving. The probe card 200 comprises a card body 202 which is supported for lateral movement over a PIC wafer by means of rod support 206. The top surface of probe card 200 includes a plurality of test IC circuits 204A and 204B which are connected, via connection lines 108A and 208B formed in the body of card 200, to a plurality of rows of corresponding contact probes 206A and 206B as shown in FIG. 22. Only six such contact probes 206A and 206B are seen in FIG. 22 but the rows of these probes extend into the plane of the figure so that there are many more contact probes than seen in this figure. A sufficient number of contact probes 206A and 206B are preferably provided that would simultaneously contact all contact pads on a single TxPIC 10 if possible; otherwise, more than one probe card 200 may be utilized to check each chip 10. As seen in the example of FIG. 22, TxPIC in wafer 11 includes rows of contacts 212 and 214, extending into the plane of the figure and formed along the edges of each TxPIC 10, thereby surrounding the centrally located, the formed active electro-optical and optical passive components in region 210 internal of the chip 10. Probe card 200 can be laterally indexed in the x-y plane to test the PICs and determine their quality and their potential operability prior to being cleaved from the chip. This testing saves processing time of later testing of individual, cleaved chips only to find out that the chips from a particular wafer were all bad.

With the foregoing processing in mind, reference is made to the flowchart of FIG. 23 illustrating a procedure for wafer level testing the output power of the semiconductor lasers with inline, integrated PDs which may later be rendered optically transparent when the PICs are cleaved from the wafer. As shown in FIG. 23, a probe card 200 is centered over a PIC to be tested in wafer and brought into contact with its contact layers to first drive at least one of the semiconductor lasers 12 (220). Note, that a back or bottom ground contact may be also made for probe card testing. Next, a modulator 14 is driven with a test signal (222). This is followed by setting the bias to the inline PD, such as PDs 105 and/or 109 in FIG. 16 (224). This is followed by measuring the power received by the PD (226) as well as measuring, off-chip, the operation of the laser, such as its output intensity and operational wavelength (227). If required, the tested laser wavelength is tuned (228). After all the lasers have been so tested, calibration data for each PIC on the wafer is generated (230) and stored (232) for use in future testing before and after backend processing to determined if there is any deterioration in the optical characteristics in any PIC. It should be noted that probe card 200 includes PIC identification circuitry and memory circuitry to identify each wafer level PIC as PIC testing is carried out so that the PICs tested can be easily later identified and correlated to the stored calibration data (232).

Reference is now made to FIGS. 24A and 24B which disclose TxPIC architectures designed to minimize interference at the PIC output waveguide 26 of any unguided or stray light propagating within TxPIC chip 10 and interfering with the multiplexed channel signals in waveguide 26 thereby deteriorating their extinction ratio as well as causing some signal interference. It should be noted that electro-optic integrated components, particularly if SOAs are present, produce stray light that can propagate through the chip. It can be particularly deleterious to the multiplexed output signals, deteriorating their quality and causing an increase in their BER at the optical receiver. In FIG. 24A, TxPIC 10 is similar to previous embodiments comprising an array of EMLs consisting of DFB laser 14 and EA modulators 14 coupled, via waveguides 24, to AWG 50. In the case here, however, it is to be noted that the arrays of EMLs are offset from AWG 50 and, furthermore, there is provided an isolation trench 234, shown in dotted line in FIG. 24A, to block any stray, unguided light from the EML arrays from interfering with output waveguides 26.

FIG. 24B is an alternate embodiment of FIG. 24A. In FIG. 24B, the orientation of the active components of TxPIC chip 10 are such that both the laser and modulator arrays are at 90° C. relative to the output waveguides 24 of AWG 50. This PIC architecture optimally minimizes the amount of unguided stray light that becomes captured by the AWG output waveguides 24 and, therefore, does not appear as noise on the multiplexed channels signals thereby improving the extinction ratio of the outgoing multiplexed signals on one or more waveguides 24. The extinction ratio loss from this stray light may be as much 1 dB. Wavelength selective combiner 50 may also be an Echelle grating.

FIG. 24C is an alternate embodiment of FIG. 24B. In the case here, rather than deploy a selective wavelength combiner, such as AWG in FIG. 24B, a free space or power combiner 50C is instead utilized. The advantages of using power combiner 50C is that its insertion loss relative to frequency is not dependent on temperature changes or variations that occur due epitaxial growth as in the case of a wavelength selective combiner. However, it has significantly higher insertion loss for multiple signal channels, which insertion loss is dependent of critical dimension variation. Such a power combiner is desirable in systems implementation wherein the link budget is not limited by the launch power. That is, the reach of the system decreases sub-linearly with the decrease in launched power from the TxPIC. Also, such a TxPIC minimizes the amount of required temperature tuning as there is no need to match the grid of the combiner to that of the grid of the transmission sources.

What is claimed is:

1. A photonic integrated circuit (PIC) chip comprising:
   a plurality of integrated electro-optic components formed on a major surface of the chip;
   a region on the chip major surface that supports a plurality of aligned bonding pads electrically coupled to at least some of the circuit electro-optic components;
   a submount for supporting the PIC chip;
   a substrate that is cantilevered from the submount over a portion of the major surface of the chip forming an air gap between the submount substrate and the chip major surface;
   a surface of the substrate supporting a plurality of elongated electrical leads across the substrate surface and terminating with ends at an edge of the substrate surface such that the substrate edge is suspended over the chip major surface bonding pad region with the substrate edge substantially aligned with the alignment of bonding pads on the major surface therebeneath so that an electrical connection can be accomplished from the ends of the electrical leads above the bonding pads directly to the bonding pads below the substrate edge.

2. The photonic integrated circuit (PIC) chip of claim 1 wherein said substrate is cantilevered along and over two sides of the chip so that two edges of said substrate overhang the chip forming the air gap between said substrate and the chip major surface.

3. The photonic integrated circuit (PIC) chip of claim 1 wherein said electrical leads are metal traces.

4. The photonic integrated circuit (PIC) chip of claim 3 wherein said metal traces are RF striplines.

5. The photonic integrated circuit (PIC) chip of claim 1 further comprising a cover formed over said substrate to protect and shield said electrical connections.

6. The photonic integrated circuit (PIC) chip of claim 1 wherein said submount comprises AlN or BeO.

7. The photonic integrated circuit (PIC) chip of claim 1 wherein said photonic integrated circuit (PIC) chip comprises:
   an array of integrated light sources, each formed in an optical waveguide of an array of optical waveguides and operating at a different wavelength and providing a respective light output comprising a channel signal;
   an optical combiner integrated on said chip, said combiner having inputs for coupled to each of said optical waveguides to receive channel signals and combine them as a combined WDM channel signal on an optical output waveguide from said chip to an output facet thereof.

8. The photonic integrated circuit (PIC) chip of claim 7 wherein said light sources are semiconductor laser sources.

9. The photonic integrated circuit (PIC) chip of claim 8 wherein said laser sources are DFB lasers or DBR lasers.

10. The photonic integrated circuit (PIC) chip of claim 7 wherein said combiner for said chips is a power coupler, star coupler or an multi-mode interference (MMI) coupler.

11. The photonic integrated circuit (PIC) chip of claim 7 wherein said combiner for said chips is a wavelength selective multiplexer.

12. The photonic integrated circuit (PIC) chip of claim 11 wherein said wavelength selective multiplexer is an arrayed waveguide grating (AWG) or an Echelle grating.

13. The photonic integrated circuit (PIC) chip of claim 7 wherein said light sources are either directly modulated to provide a modulated output comprising a channel signal from each of said laser sources or an array of electro-optic modulators is integrated on said chip, one each in an optical waveguide of said waveguide array to receive the respective light output from a laser source to provide a modulated output comprising a channel signal;
   all of said modulated channel signals representative of and approximating a designated wavelength on a predetermined wavelength grid.

14. The photonic integrated circuit (PIC) chip of claim 13 wherein said electro-optic modulators are electro-absorption modulators or Mach-Zehnder modulators.

15. The photonic integrated circuit (PIC) chip of claim 1 wherein said chip is fabricated employing alloys of InGaAsP/InP or InAlGaAs/InP with growth via metalorganic chemical vapor deposition (MOCVD).

16. The photonic integrated circuit (PIC) chip of claim 1 wherein said cantilevered substrate is comprised of a ceramic material.

17. The photonic integrated circuit (PIC) chip of claim 1 wherein said cantilevered second substrate is comprised of a ceramic material.

18. A chip module comprising:
   a monolithic photonic integrated circuit (PIC) chip, said chip including at least one array of electro-optic components integrated on said chip;
   a submount for mounting said chip;
   a first substrate formed on said submount and surrounding at least a portion of said chip;
   a second substrate supported on said first substrate and cantilevered, at least in part, over said chip forming an air gap between said chip and a bottom surface of said second substrate; and
   a plurality of metal lines formed on a surface of said second substrate and extending over said chip for electrical connection along one edge of said second substrate to bonding pads on said chip beneath said second substrate edge.

19. The chip module of claim 18 wherein said first substrate is formed along and adjacent to two sides of said submount so that two edges of said second substrate are cantilevered over said chip forming said air gap between said second substrate and said chip.

20. The chip module of claim 18 wherein said metal lines are RF striplines formed on said second substrate.

21. The chip module of claim 18 wherein a thickness of said first substrate is greater than the thickness of said chip in order to provide said air gap upon positioning of said cantilevered second substrate on said first substrate.

22. The chip module of claim 18 further comprising a cover formed over said second substrate to protect and shield said metal lines.

23. The chip module of claim 22 wherein said cover includes recessed regions formed in said second substrate at opposite ends there to expose end portions of said metal lines.

24. The chip module of claim 18 wherein said submount comprises AlN or BeO.

25. The chip module of claim 18 wherein said monolithic photonic integrated circuit (PIC) chip comprises:
   an array of integrated light sources, each formed in an optical waveguide of an array of optical waveguides and operating at a different wavelength and providing a respective light output comprising a channel signal;

an optical combiner integrated on said chip, said combiner having inputs for coupled to each of said optical waveguides to receive channel signals and combine them as a combined WDM channel signal on an optical output waveguide from said chip to an output facet thereof.

26. The chip module of claim 25 wherein said light sources are semiconductor laser sources.

27. The chip module of claim 26 wherein said laser sources are DFB lasers or DBR lasers.

28. The chip module of claim 25 wherein said combiner for said chips is a power coupler, star coupler or a multi-mode interference (MMI) coupler.

29. The chip module of claim 25 wherein said combiner for said chips is a wavelength selective multiplexer.

30. The chip module of claim 29 wherein said wavelength selective multiplexer is an arrayed waveguide grating (AWG) or an Echelle grating.

31. The chip module of claim 25 wherein said light sources are either directly modulated to provide a modulated output comprising a channel signal from each of said laser sources or an array of electro-optic modulators is integrated on said chip, one each in an optical waveguide of said waveguide array to receive the respective light output from a laser source to provide a modulated output comprising a channel signal;
all of said modulated channel signals representative of and approximating a designated wavelength on a predetermined wavelength grid.

32. The chip module of claim 31 wherein said electro-optic modulators are electro-absorption modulators or Mach-Zehnder modulators.

33. The chip module of claim 18 wherein said chip is fabricated employing alloys of InGaAsP/InP or InAlGaAs/InP with growth via metalorganic chemical vapor deposition (MOCVD).

34. An assembly for a photonic integrated circuit (PIC) chip comprising:
a submount for supporting the chip on a surface thereof;
a plurality of integrated electro-optic modulators formed on a major surface of the chip;
an array of bonding pads on the major surface for receiving RF modulaton signals to drive said electro-optic modulators;
a first substrate supported on said submount along at least one edge of said submount;
a second substrate supported from said first substrate by having at least a first edge cantilevered from said first substrate so that a second edge of said substrate extends over and spaced from and above said bonding pad array of said chip major surface;
RF means supported on a major surface of said second substrate at said second edge above said chip major surface bonding pads to provide direct overhead acces for RF modulation signals from said RF means to said bonding pad array below said second edge.

35. The assembly of claim 34 further comprising means for electrical connecting said RF means to said array bonding pads.

36. The assembly of claim 35 wherein said electrical connecting means comprises bonding wires, wire ribbon, or a flexible circuit cable.

37. The assembly of claim 34 wherein said second substrate comprises a ceramic material.

* * * * *